(12) United States Patent
Song et al.

(10) Patent No.: US 11,678,446 B2
(45) Date of Patent: Jun. 13, 2023

(54) DISPLAY DEVICE

(71) Applicant: LG Display Co., Ltd., Seoul (KR)

(72) Inventors: JiHun Song, Seoul (KR); ChounSung Kang, Gimpo-si (KR); Mi-Na Shin, Paju-si (KR); Hoiyong Kwon, Seoul (KR); GeunChang Park, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 1 day.

(21) Appl. No.: 16/990,178

(22) Filed: Aug. 11, 2020

(65) Prior Publication Data

US 2021/0051809 A1 Feb. 18, 2021

(30) Foreign Application Priority Data

Aug. 16, 2019 (KR) .................. 10-2019-0100278
Dec. 5, 2019 (KR) .................. 10-2019-0160600

(51) Int. Cl.
*H05K 5/02* (2006.01)
*H05K 5/00* (2006.01)
*H05K 7/20* (2006.01)

(52) U.S. Cl.
CPC .......... *H05K 5/0217* (2013.01); *H05K 5/0017* (2013.01); *H05K 7/20954* (2013.01)

(58) Field of Classification Search
CPC ............ H05K 5/0217; H05K 5/0017; H05K 7/20954; H05K 1/028; H05K 1/116; G09F 9/301; G06F 1/1652
See application file for complete search history.

(56) References Cited

U.S. PATENT DOCUMENTS 11,013,130 B2   5/2021   Shin et al.
2016/0147345 A1  5/2016   Lee et al.
(Continued)

FOREIGN PATENT DOCUMENTS

EP     3591497 A1      8/2020
JP     2012-118303 A   6/2012
(Continued)

OTHER PUBLICATIONS

Notice of Reasons for Refusal Office Action issued in corresponding JP Patent Application No. 2020-136941 dated Aug. 20, 2021.
(Continued)

*Primary Examiner* — Stephen S Sul
(74) *Attorney, Agent, or Firm* — Morgan, Lewis & Bockius LLP

(57) ABSTRACT

A display device may include a display panel, a first back cover disposed on a rear surface of the display panel, at least one flexible film which is electrically connected to one end of the display panel and is bent toward a rear surface of the first back cover or a front surface of the display panel, and a printed circuit board which is electrically connected to the at least one flexible film and disposed on the rear surface of the first back cover or the at least one flexible film. The printed circuit board overlaps one end of the display panel. Accordingly, one end of the display panel in which the pad area which is vulnerable to the stress is disposed and the printed circuit board are maintained to be flat, to minimize the damage of the display device.

23 Claims, 26 Drawing Sheets

(56) References Cited

U.S. PATENT DOCUMENTS

| | | | |
|---|---|---|---|
| 2016/0323993 A1* | 11/2016 | Kwon | G02F 1/133305 |
| 2016/0363960 A1* | 12/2016 | Park | G09F 9/301 |
| 2016/0373654 A1 | 12/2016 | Kwon et al. | |
| 2016/0374228 A1* | 12/2016 | Park | H05K 7/16 |
| 2017/0156219 A1* | 6/2017 | Heo | H01L 51/0097 |
| 2017/0318688 A1* | 11/2017 | Kim | H05K 5/0017 |
| 2017/0318689 A1* | 11/2017 | Kim | H05K 5/0017 |
| 2018/0059727 A1* | 3/2018 | Seo | G06F 1/1643 |
| 2018/0150164 A1* | 5/2018 | Naganuma | H01L 27/3276 |
| 2019/0098774 A1* | 3/2019 | Park | G09F 9/301 |
| 2019/0198783 A1 | 6/2019 | Kim et al. | |
| 2020/0008308 A1 | 1/2020 | Shin et al. | |
| 2020/0092987 A1* | 3/2020 | Kim | H05K 1/0268 |
| 2020/0333833 A1* | 10/2020 | Mun | G02F 1/133308 |

FOREIGN PATENT DOCUMENTS

| | | |
|---|---|---|
| JP | 2020-003794 A | 1/2020 |
| KR | 10-2017-0006013 A | 1/2017 |
| KR | 10-1975188 B1 | 5/2019 |
| TW | 201802781 A | 1/2018 |
| TW | 201928464 A | 7/2019 |

OTHER PUBLICATIONS

Office Action and Search Report issued in corresponding TIPO Patent Application No. 109127651, dated Aug. 19, 2021.
Extended European Search Report dated Jan. 15, 2021, issued in corresponding European Patent Application No. 20190693.0.
Decision to Grant a Patent dated Mar. 1, 2022, issued in corresponding Japanese Patent Application No. 2020-136941.

* cited by examiner

DISPLAY DEVICE

CROSS-REFERENCE TO RELATED APPLICATIONS

This application claims the priority of Korean Patent Applications No. 10-2019-0160600 filed on Dec. 5, 2019, and No. 10-2019-0100278 filed on Aug. 16, 2019, in the Korean Intellectual Property Office, the disclosure of which is incorporated herein by reference.

BACKGROUND

Technical Field

The present disclosure relates to a display device, and more particularly, to a rollable display device which is capable of displaying images even in a rolled state.

Discussion of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display element and a wiring line on a flexible substrate such as plastic which is a flexible material so as to be capable of displaying images even though the display device is rolled is getting attention as a next generation display device.

SUMMARY

Accordingly, embodiments of the present disclosure are directed to a display device that substantially obviates one or more of the problems due to limitations and disadvantages of the related art.

An aspect of the present disclosure is to provide a display device that minimizes damages of a plurality of flexible films, a printed circuit board, and a display panel due to repeated winding and unwinding.

Another aspect of the present disclosure is to provide a display device that minimizes separation between a back cover and a display panel when the display device is wound around a roller.

Still another aspect of the present disclosure is to provide a display device that maintains a pad area of the display panel that is vulnerable to a stress generated by winding the display device to be flat.

Still another aspect of the present disclosure is to provide a display device that easily dissipating heat of a plurality of flexible films.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a display panel, a first back cover disposed on a rear surface of the display panel, at least one flexible film which is electrically connected to one end of the display panel and is bent toward a rear surface of the first back cover or a front surface of the display panel, and a printed circuit board which is electrically connected to the at least one flexible film and disposed on the rear surface of the first back cover or the at least one flexible film. The printed circuit board overlaps one end of the display panel. Accordingly, one end of the display panel in which a pad area which is vulnerable to the stress is disposed and the printed circuit board are maintained to be flat, to minimize the damage of the display device.

Other detailed matters of the exemplary embodiments are included in the detailed description and the drawings.

According to the present disclosure, even when the display device is wound, the pad area of the display panel and the printed circuit board are maintained to be flat so that the damage of the pad area and the printed circuit board due to the bending may be minimized.

According to the present disclosure, when the display device is wound, one end of a display panel is accommodated in a cover unit so that the end of the display panel is not loosened, thereby minimizing the separation between the display panel and the back cover.

According to the present disclosure, when the display device is wound and unwound, the plurality of flexible films is not repeatedly folded and unfolded to improve the reliability of the plurality of flexible films.

According to the present disclosure, heat generated from the driving IC of the plurality of flexible films is easily dissipated to the outside of the display device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
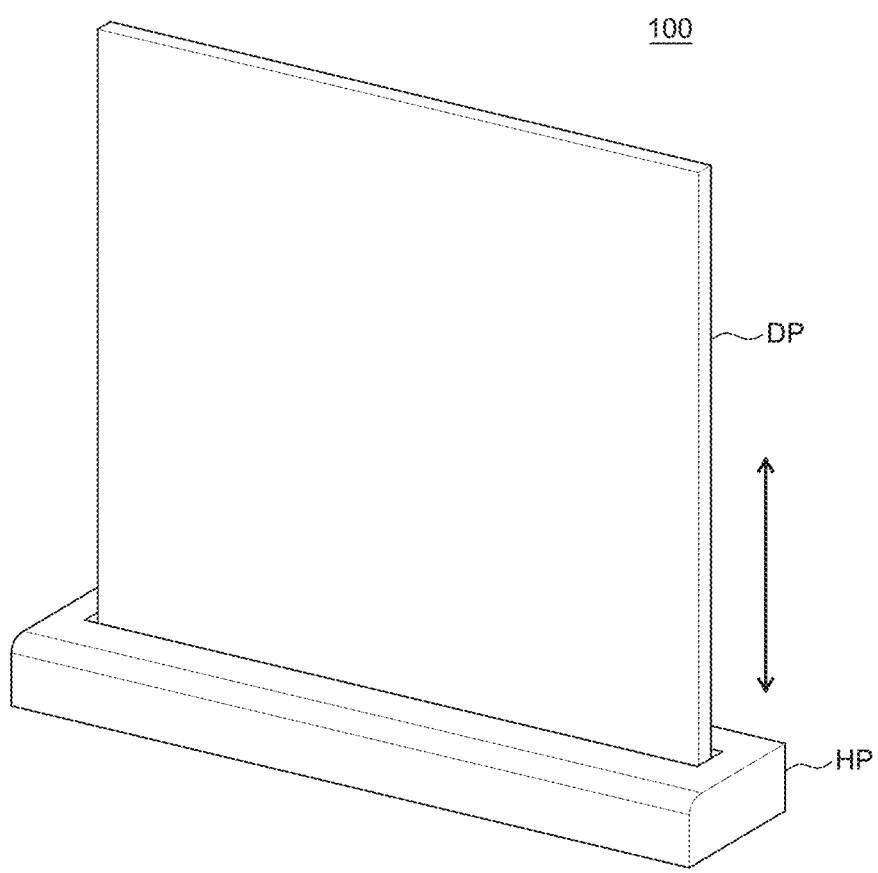
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

A rollable display device may be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
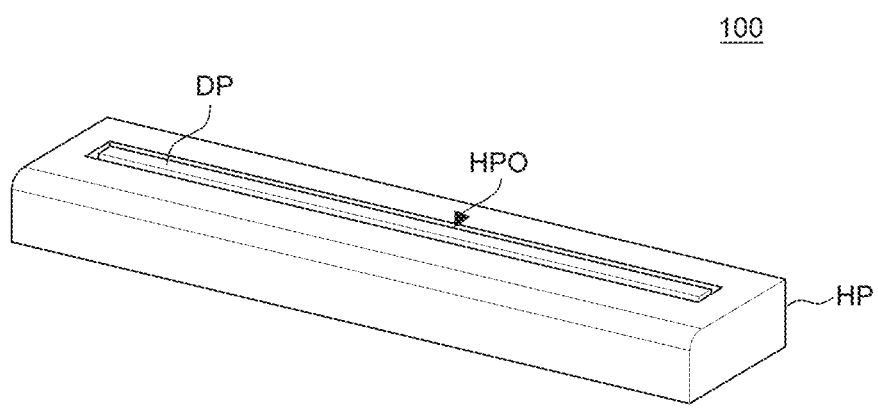

FIGS. 1A and 1B are perspective views of a display device according to an exemplary embodiment of the present disclosure. Referring to FIGS. 1A and 1B, a display device according to an exemplary embodiment of the present disclosure includes a display unit DP and a housing unit HP.

The display unit DP is a configuration for displaying images to a user and for example, in the display unit DP, a display element and a circuit, a wiring line, and a component for driving the display element may be disposed.

In this case, since the display device 100 according to an exemplary embodiment of the present disclosure is a rollable display device 100, the display unit DP may be configured to be wound and unwound. For example, the display unit DP may be formed of a display panel 120 and a back cover 110 each having flexibility to be wound or unwound. The display unit DP will be described below in more detail with reference to FIGS. 4 to 6.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO so that the display unit DP moves to the inside and the outside of the housing unit HP. The display unit DP may move in a vertical direction by passing through the opening HPO of the housing unit HP.

In the meantime, the display unit DP of the display device 100 may be switched from a fully unwound state to a fully wound state or from a fully wound state to a fully unwound state.

FIG. 1A illustrates the display unit DP of the display device 100 which is fully unwound and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In the meantime, in order to switch the display unit DP to a fully unwound state or a fully wound state, a driving unit MP (see FIG. 2) which winds or unwinds the display unit DP is disposed.

Figure 2:
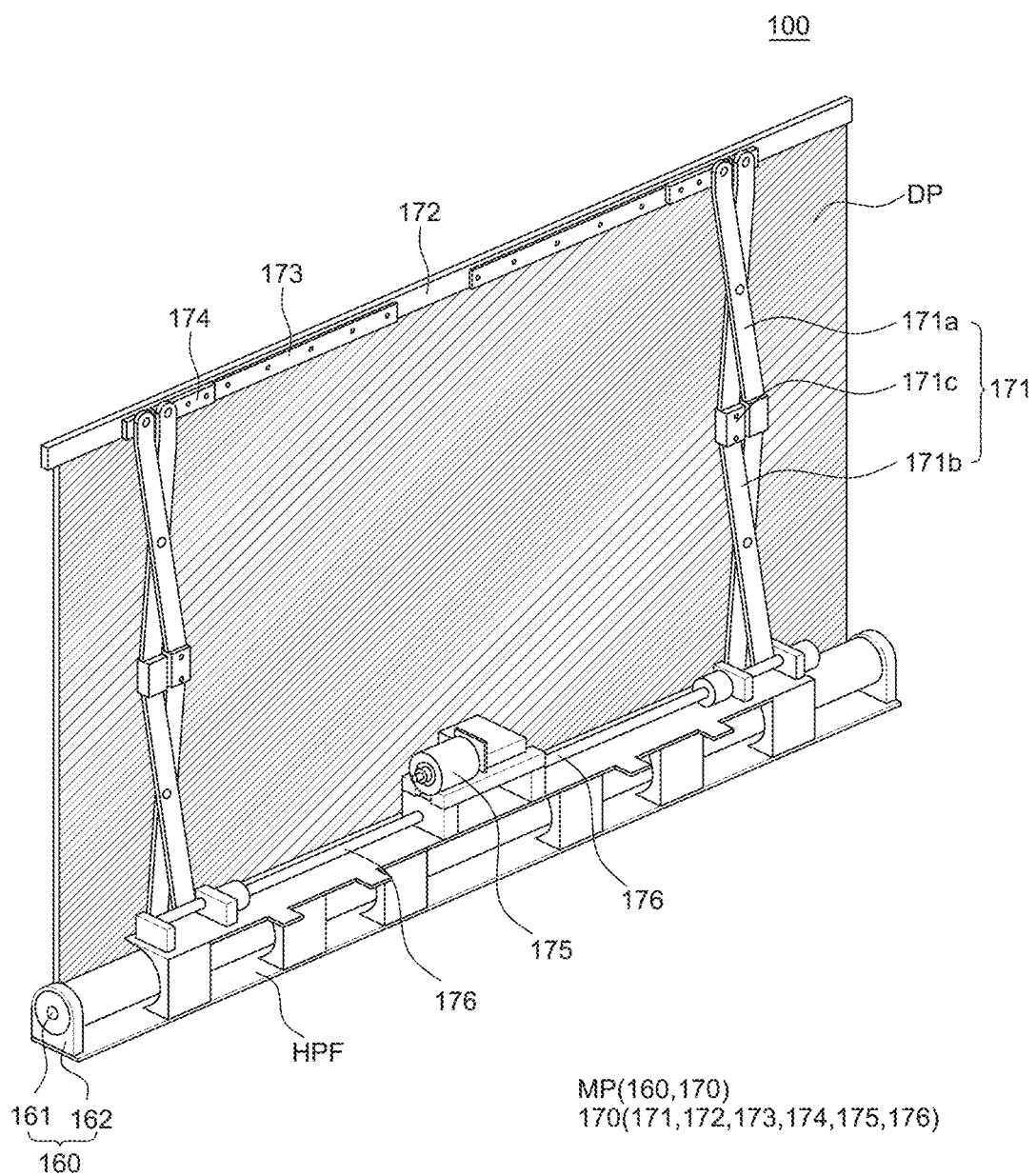
FIG. 2 is a perspective view of a display device according to an exemplary embodiment of the present disclosure.

FIG. 2 is a perspective view of a display device according to an exemplary embodiment of the present disclosure.

Figure 3:
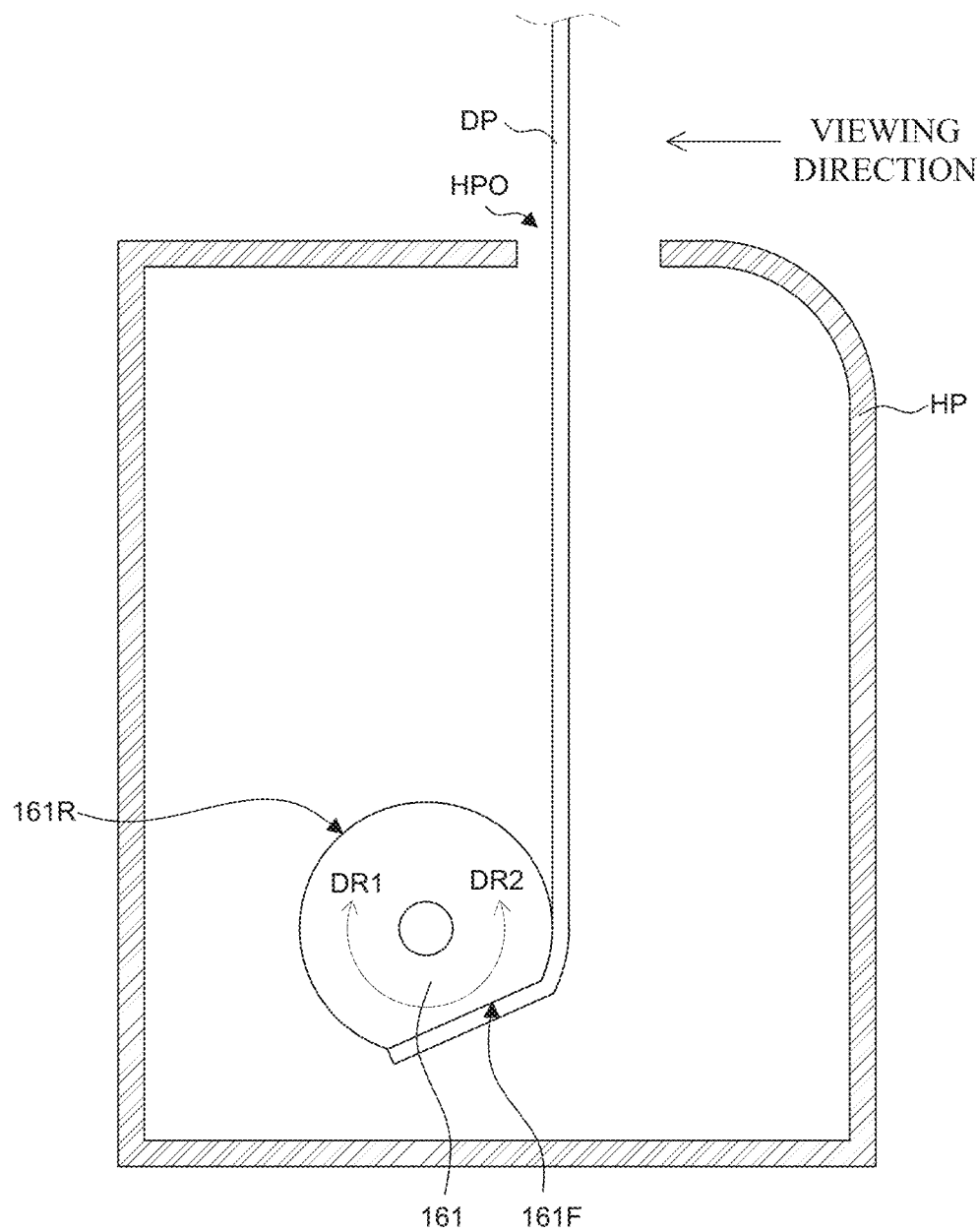
FIG. 3 is a schematic cross-sectional view of a display device according to an exemplary embodiment of the present disclosure.

FIG. 3 is a schematic cross-sectional view of a display device according to an exemplary embodiment of the present disclosure.

FIG. 3 is a schematic cross-sectional view for explaining a roller 161 and a display unit DP of a display device 100 according to an exemplary embodiment of the present disclosure. For the convenience of description, in FIG. 3, only a housing unit HP, a roller 161, and a display unit DP are illustrated.

First, referring to FIG. 2, the driving unit MP includes a roller unit 160 and a lifting unit 170.

The roller unit 160 rotates in a clockwise direction or a counterclockwise direction to wind or unwind the display unit DP fixed to the roller unit 160. The roller unit 160 includes a roller 161 and a roller support unit 162.

The roller 161 is a member around which the display unit DP is wound. The roller 161 may be, for example, formed to have a cylindrical shape. A lower edge of the display unit DP may be fixed to the roller 161. When the roller 161 rotates, the display unit DP which is fixed to the roller 161 through the lower edge may be wound around the roller 161. In contrast, when the roller 161 rotates in an opposite direction, the display unit DP which is wound around the roller 161 may be unwound from the roller 161.

Referring to FIG. 3, the roller 161 may be formed to have a cylindrical shape in which at least a part of an outer circumferential surface of the roller 161 is flat and the remaining part of the outer circumferential surface is a curved portion. Even though the roller 161 may be entirely a cylindrical shape, but a part may be formed of a flat surface. That is, a part of the outer circumferential surface of the roller 161 is formed to be flat and the remaining part of the outer circumferential surface is formed to be a curved surface. For example, the roller 161 is configured by a curved portion 161R and a flat portion 161F, and on the flat portion 161F of the roller 161, the plurality of flexible films and the printed circuit board of the display unit DP are seated. However, the roller 161 may have a completely cylindrical shape or an arbitrary shape which may wind the display unit DP, but is not limited thereto.

Referring to FIG. 2 again, the roller support unit 162 supports the roller 161 at both sides of the roller 161. Specifically, the roller support unit 162 is disposed on a bottom surface HPF of the housing unit HP. Upper side surfaces of the roller support unit 162 are coupled to both ends of the roller 161. By doing this, the roller support unit 162 may support the roller 161 to be spaced apart from the bottom surface HPF of the housing unit HP. In this case, the roller 161 may be rotatably coupled to the roller support unit 162.

The lifting unit 170 moves the display unit DP in a vertical direction in accordance with the driving of the roller unit 160. The lifting unit 170 includes a link unit 171, a head bar 172, a slide rail 173, a slider 174, a motor 175, and a rotary unit 176.

The link unit 171 of the lifting unit 170 includes a plurality of links 171a and 171b, and a hinge unit 171c which connects the plurality of links 171a and 171b to each other. Specifically, the plurality of links 171a and 171b includes a first link 171a and a second link 171b, and the first link 171a and the second link 171b cross each other in the form of scissors to be rotatably fastened by means of the hinge unit 171c. When the link unit 171 moves in the vertical direction, the plurality of links 171a and 171b rotates to be far away from each other or close to each other.

The head bar 172 of the lifting unit 170 is fixed to an uppermost end of the display unit DP. The head bar 172 is coupled to the link unit 171 to move the display unit DP in the vertical direction in accordance with the rotation of the plurality of links 171a and 171b of the link unit 171. That is, the display unit DP may move in a vertical direction by the head bar 172 and the link unit 171.

The head bar 172 covers only a part of a surface which is adjacent to an uppermost edge of the display unit DP so as not to hide an image displayed on the front surface of the display unit DP. The display unit DP and the head bar 172 may be fixed by a screw, but are not limited thereto.

The slide rail 173 of the lifting unit 170 provides a movement path of the plurality of links 171a and 171b. Parts of the plurality of links 171a and 171b are rotatably fastened with the slide rail 173 so that the motion is guided along a trajectory of the slide rail 173. Parts of the plurality of links 171a and 171b are fastened with the slider 174 which is movably provided along the slide rail 173 to move along a trajectory of the slide rail 173.

The motor 175 is connected to a power generating unit, such as a separate external power source or a built-in battery, to be supplied with the power. The motor 175 generates a torque to provide a driving force to the rotary unit 176.

The rotary unit 176 is connected to the motor 175 to be configured to convert a rotational motion from the motor 175 into a linear reciprocating motion. That is, the rotational motion of the motor 175 may be converted into the linear reciprocating motion of a structure fixed to the rotary unit 176. For example, the rotary unit 176 may be implemented by a shaft and a ball screw including a nut which is fastened with the shaft, but is not limited thereto.

The motor 175 and the rotary unit 176 interwork with the link unit 171 to lift and lower the display unit DP. The link unit 171 is formed with a link structure to receive the driving force from the motor 175 and the rotary unit 176 to be repeatedly folded or unfolded.

Specifically, when the display unit DP is wound, the motor 175 is driven so that the structure of the rotary unit 176 may perform linear motion. That is, a part of the rotary unit 176 to which one end of the second link 171b is coupled may perform the linear motion. Therefore, one end of the second link 171b moves to the motor 175 and the plurality of links 171a and 171b is folded so that the height of the link unit 171 may be lowered. Further, while the plurality of links 171a and 171b is folded, the head bar 172 coupled to the first link 171a is also lowered, and one end of the display unit DP coupled to the head bar 172 is also lowered.

When the display unit DP is unwound, the motor 175 is driven so that the structure of the rotary unit 176 may perform linear motion. That is, a part of the rotary unit 176 to which one end of the second link 171b is coupled may perform the linear motion. Therefore, one end of the second link 171b moves to be away from the motor 175 and the plurality of links 171a and 171b is unfolded so that the height of the link unit 171 may be increased. Further, while the plurality of links 171a and 171b is unfolded, the head bar 172 coupled to the first link 171a is also lifted and the display unit DP coupled to the head bar 172 is also lifted.

Accordingly, when the display unit DP is fully wound around the roller 161, the link unit 171 of the lifting unit 170 maintains a folded state. That is, when the display unit DP is fully wound around the roller 161, the lifting unit 170 may have a smallest height. In contrast, when the display unit DP is fully unwound, the link unit 171 of the lifting unit 170 maintains a stretched state. That is, when the display unit DP is fully unwound, the lifting unit 170 may have a largest height.

In the meantime, when the display unit DP is wound, the roller 161 may rotate and the display unit DP may be wound around the roller 161. Referring to FIG. 3, a lower edge of the display unit DP is coupled to the roller 161. When the roller 161 rotates in a first direction DR1, that is, a clockwise direction, the display unit DP may be wound while a rear surface of the display unit DP is in close contact with a front surface of the roller 161.

When the display unit DP is unwound, the roller 161 may rotate and the display unit DP may be unwound from the roller 161. For example, referring to FIG. 3, when the roller 161 rotates in a second direction DR2, that is, in a counter-clockwise direction, the display unit DP which is wound around the roller 161 is unwound from the roller 161 to be disposed at the outside of the housing unit HP.

In some exemplary embodiments, a driving unit MP having another structure other than the above-described driving unit MP may be applied to the display device 100. That is, as long as the display unit DP can be wound and unwound, the above-described configuration of the roller unit 160 and the lifting unit 170 may be modified, some configurations may be omitted, or another configuration may be added.

Figure 4:
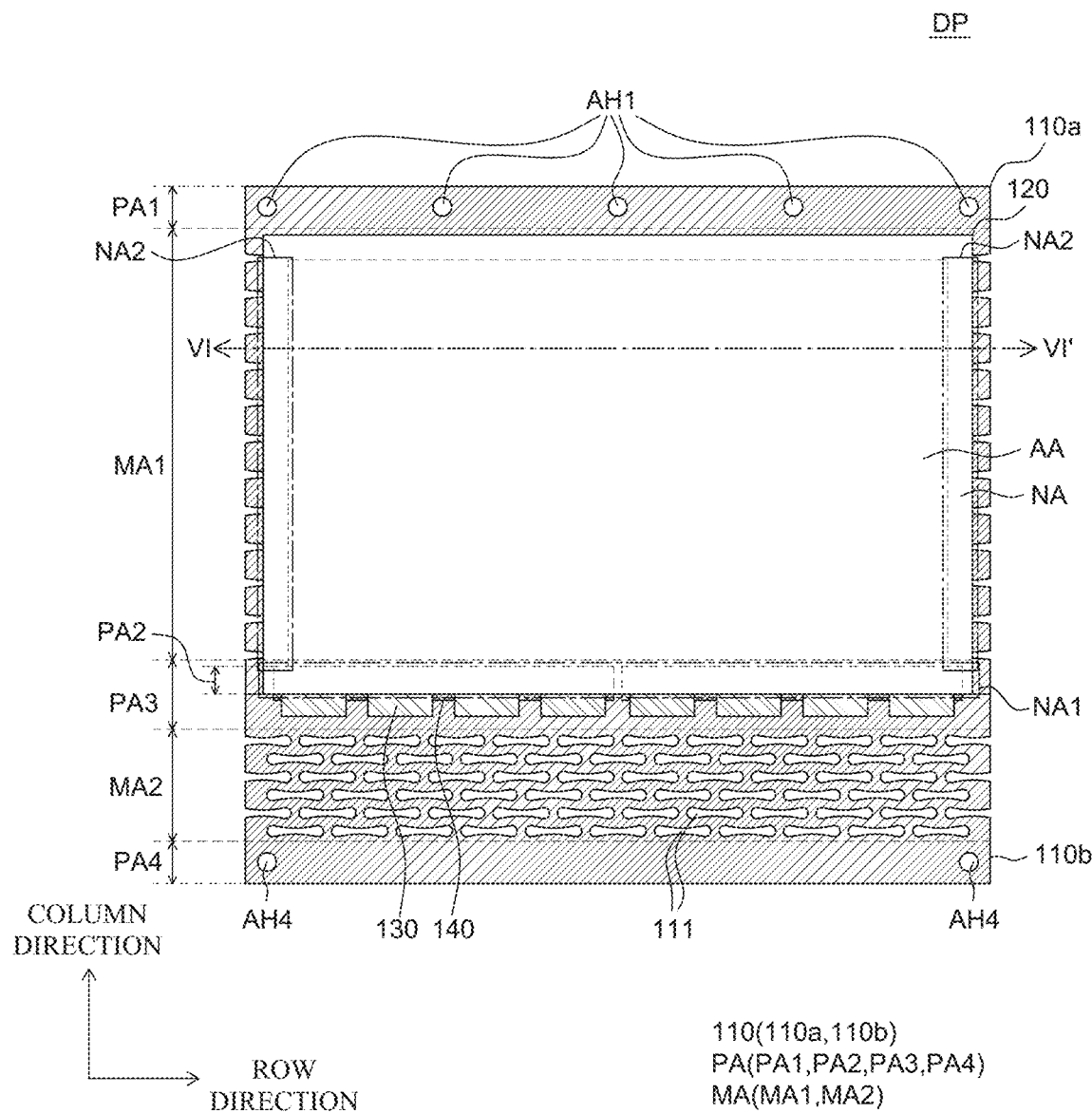
FIG. 4 is a plan view of a display unit of a display device according to an exemplary embodiment of the present disclosure.

FIG. 4 is a plan view of a display unit of a display device according to an exemplary embodiment of the present disclosure.

Figure 5:
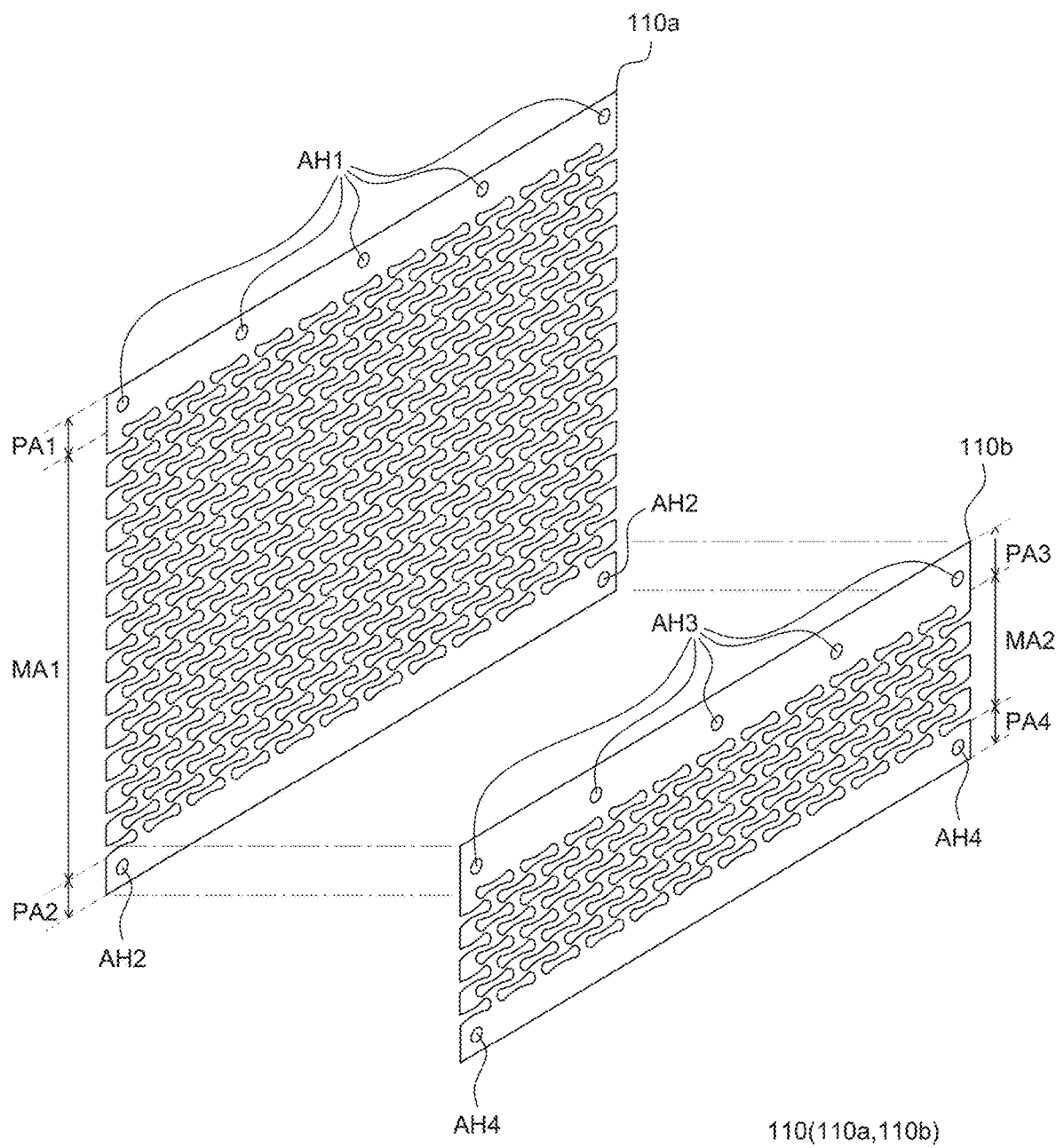
FIG. 5 is an exploded perspective view of a back cover of a display device according to an exemplary embodiment of the present disclosure.

FIG. 5 is an exploded perspective view of a back cover of a display device according to an exemplary embodiment of the present disclosure.

Figure 6:
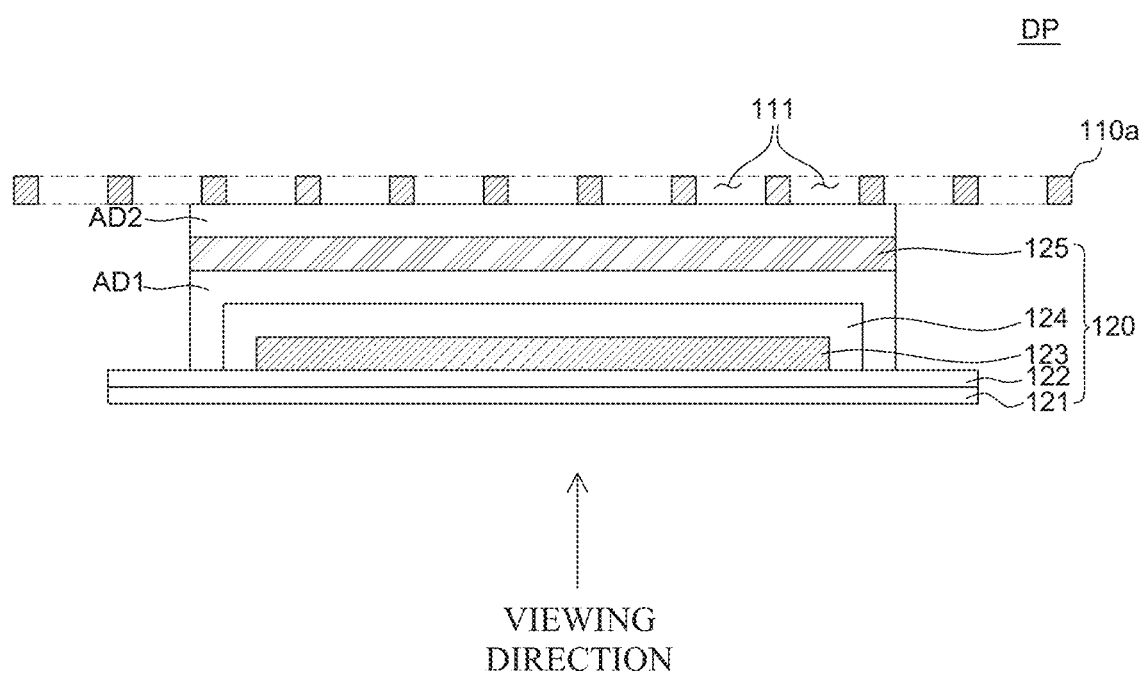
FIG. 6 is a cross-sectional view taken along the line VI-VI' of FIG. 4.

FIG. 6 is a cross-sectional view taken along the line VI-VI' of FIG. 4.

Referring to FIGS. 4 to 6, the display unit DP includes a back cover 110, a display panel 120, a plurality of flexible films 130, and a printed circuit board 140. In FIG. 4, the cover unit is not illustrated for convenience of the description.

Referring to FIG. 4, the back cover 110 is disposed on a rear surface of the display panel 120 to support the display panel 120. A size of the back cover 110 may be larger than a size of the display panel 120. The back cover 110 may protect other configurations of the display unit DP from the outside.

Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar or plastic. However, if the material of the back cover 110 satisfies physical conditions such as a thermal strain amount, a radius of curvature, and a rigidity, the material may be diversely changed depending on the design, and is not limited thereto.

Referring to FIGS. 4 and 5 together, the back cover 110 includes a first back cover 110a and a second back cover 110b. The back cover 110 may be configured to be divided into the first back cover 110a and the second back cover 110b. The first back cover 110a may be fastened with the head bar 172 and the second back cover 110b may be fastened with the roller 161.

The first back cover 110a and the second back cover 110b include a plurality of support areas PA and a plurality of malleable areas MA. The plurality of support areas PA is areas where a plurality of openings 111 is not disposed and the plurality of malleable areas MA is areas where a plurality of openings 111 is disposed. Specifically, the first back cover 110a includes a first support area PA1, a first malleable area MA1, and a second support area PA2 and the first support area PA1, the first malleable area MA1, and the second support area PA2 are sequentially disposed from an uppermost end of the first back cover 110a. The second back cover 110b includes a third support area PA3, a second malleable area MA2, and a fourth support area PA4 and the third support area PA3, the second malleable area MA2, and the fourth support area PA4 are sequentially disposed from an uppermost end of the second back cover 110b. In this case, since the back cover 110 is wound or unwound in a column direction, the plurality of support areas PA and the plurality of malleable areas MA may be disposed along the column direction.

The first support area PA1 of the first back cover 110a is an uppermost area of the back cover 110 and is fastened with the head bar 172. The first support area PA1 includes first fastening holes AH1 to be fastened with the head bar 172. For example, screws which pass through the head bar 172 and the first fastening holes AH1 are disposed so that the head bar 172 is fastened with the first support area PA1. As the first support area PA1 is fastened with the head bar 172, when the link unit 171 which is fastened with the head bar 172 is lifted or lowered, the back cover 110 is also lifted and lowered together with the display panel 120 which is attached to the back cover 110. Even though five first fastening holes AH1 are illustrated in FIGS. 4 and 5, the number of first fastening holes AH1 is not limited thereto. Further, even though it has been described that the first back cover 110a is fastened with the head bar 172 using the first fastening holes AH1, it is not limited thereto and the first back cover 110a and the head bar 172 may be fastened with each other without using a separate fastening hole.

The first malleable area MA1 of the first back cover 110a is an area which extends from the first support area PA1 to a lower side of the first back cover 110a. The first malleable area MA1 is an area in which a plurality of openings 111 is disposed and the display panel 120 is attached. Specifically, the first malleable area MA1 is an area which is wound around or unwound from the roller 161 together with the display panel 120. The first malleable area MA1 may overlap at least the display panel 120 among other configurations of the display unit DP.

The second support area PA2 of the first back cover 110a is an area which extends from the first malleable area MA1 and is a lowermost side of the first back cover 110a. One end of the display panel 120 is disposed in the second support area PA2. For example, a pad area NA1 at one end of the display panel 120 may be disposed in the second support area PA2.

Referring to FIG. 5, second fastening holes AH2 are disposed in the second support area PA2. The second fastening holes AH2 may be holes through which the cover unit to be described below and the first back cover 110a are fixed to each other. Even though two second fastening holes AH2 are illustrated in FIG. 5, the number of second fastening holes AH2 is illustrative and is not limited thereto.

The third support area PA3 of the second back cover 110b is an uppermost area of the second back cover 110b and the plurality of flexible films 130 and the printed circuit board 140 are disposed therein. The third support area PA3 may overlap one end of the first back cover 110a. For example, the third support area PA3 may overlap the entire second support area PA2 and a part of the first malleable area MA1.

Third fastening holes AH3 are disposed in the third support area PA3. The third fastening holes AH3 may be holes through which the cover unit to be described below and the second back cover 110b are fixed to each other. Even though five third fastening holes AH3 are illustrated in FIG. 5, the number of third fastening holes AH3 is illustrative and is not limited thereto.

In FIG. 5, it has been described that the second fastening holes AH2 and the third fastening holes AH3 are disposed in the second support area PA2 and the third support area PA3, respectively, to fasten the cover unit and the first back cover 110a and the second back cover 110b with each other. However, the first back cover 110a and the second back cover 110b may be fastened with the cover unit without using a separate fastening hole and the present disclosure is not limited thereto.

In the meantime, when the second support area PA2 and the third support area PA3 are wound around the roller 161, a part of an outer circumferential surface of the roller 161 which is in contact with the second support area PA2 and the third support area PA3 may be formed to be flat. Accordingly, the second support area PA2 and the third support area PA3 may be maintained to be flat regardless of being wound or unwound to the roller 161. Further, the pad area NA1 at one end of the display panel 120 and the printed circuit board 140 disposed in the second support area PA2 and the third support area PA3 may also be maintained to be flat.

The second malleable area MA2 of the second back cover 110b is an area which extends from the third support area PA3 to a lower side of the second back cover 110b. In the second malleable area MA2, a plurality of openings 111 is disposed and the second malleable area MA2 extends to dispose the display area AA of the display panel 120 at the outside of the housing unit HP. For example, when the back cover 110 and the display panel 120 are fully unwound, an area from the fourth support area PA4 of the second back cover 110b which is fixed to the roller 161 to the third support area PA3 in which the plurality of flexible films 130 and the printed circuit board 140 are disposed may be disposed in the housing unit HP. The first malleable area MA1 and the first support area PA1 in which the display area AA of the display panel 120 is disposed may be disposed at the outside of the housing unit HP. That is, an area from the fourth support area PA4 fixed to the roller 161 to the second malleable area MA2, at least a part of the third support area PA3, and the second support area PA2 may be disposed in the housing unit HP.

In this case, when a length from the fourth support area PA4 fixed to the roller 161 to the second support area PA2 is smaller than a length from the roller 161 to the opening HPO of the housing unit HP, a part of the display area AA of the display panel 120 may be disposed in the housing unit HP. When a part of the display area AA is disposed in the housing unit HP, it may be difficult to watch the images. Therefore, the length from the fourth support area PA4 fixed to the roller 161 to the second support area PA2 may be designed in consideration of a length from the roller 161 to the opening HPO of the housing unit HP.

The fourth support area PA4 is an area extending from the second malleable area MA2 to the lower side of the second back cover 110b. The fourth support area PA4 is a lowermost area of the second back cover 110b and is fastened with the roller 161. The fourth support area PA4 may include fourth fastening holes AH4 to be fastened with the roller 161. For example, screws which pass through the roller 161 and the fourth fastening holes AH4 are disposed to fasten the roller 161 and the fourth support area PA4 of the second back cover 110b with each other. As the fourth support area PA4 is fastened with the roller 161, the first back cover 110a and the second back cover 110b may be wound around or unwound from the roller 161. Even though two fourth fastening holes AH4 are illustrated in FIGS. 4 and 5, the number of fourth fastening holes AH4 is not limited thereto.

In the meantime, in the first support area PA1, the second support area PA2, the third support area PA3, and the fourth support area PA4, the plurality of openings 111 as formed in the plurality of malleable areas MA is not formed. Specifically, the first fastening holes AH1, the second fastening holes AH2, the third fastening holes AH3, and the fourth fastening holes AH4 are formed only in each of the first support area PA1, the second support area PA2, the third support area PA3, and the fourth support area PA4, respectively. However, the plurality of openings 111 as formed in the plurality of malleable areas MA is not formed therein. Further, the first fastening holes AH1, the second fastening holes AH2, the third fastening holes AH3, and the fourth fastening holes AH4 have different shapes from that of the plurality of openings 111.

The first support area PA1 is an area fixed to the head bar 172, the second support area PA2 is an area where one end of the display panel 120 is supported, and the third support area PA3 is an area where the plurality of flexible films 130 and the printed circuit board 140 are supported. The fourth support area PA4 is an area fixed to the roller 161. Therefore, the support areas may have a rigidity larger than that of the plurality of malleable areas MA. Specifically, as the first support area PA1, the second support area PA2, the third support area PA3, and the fourth support area PA4 have the rigidity, the first support area PA1 and the fourth support area PA4 may be firmly fixed to the head bar 172 and the roller 161 respectively. The second support area PA2 and the third support area PA3 maintain the pad area NA1 and the printed circuit board 140 at one end of the display panel 120 to be flat to protect the pad area NA1 and the printed circuit board 140 of the display panel 120. Therefore, the display unit DP is fixed to the roller 161 and the head bar 172 of the driving unit MP to move to the inside or the outside of the housing unit HP in accordance with the operation of the driving unit MP and protect the pad area NA1 and the printed circuit board 140 at one end of the display panel 120.

In the meantime, in FIG. 4, even though it is illustrated that the plurality of support areas PA and the plurality of malleable areas MA of back cover 110 are sequentially disposed along the column direction, when the back cover 110 is wound in the row direction, the plurality of support areas PA and the plurality of malleable areas MA may be sequentially disposed along a row direction.

When the display unit DP is wound or unwound, the plurality of openings 111 disposed in the plurality of malleable areas MA of the back cover 110 may be deformed by a stress which is applied to the display unit DP. Specifically, when the display unit DP is wound or unwound, the plurality of malleable areas MA of the back cover 110 may be deformed as the plurality of openings 111 contracts or expands. Further, as the plurality of openings 111 contracts or expands, a slip phenomenon of the display panel 120 disposed on the first malleable area MA1 of the first back cover 110a is minimized so that the stress which is applied to the display panel 120 may be minimized.

When the display panel 120 and the back cover 110 are wound, a difference between a length of the display panel 120 which is wound around the roller 161 and a length of the back cover 110 which is wound around the roller 161 may be caused due to the difference of radii of curvature of the display panel 120 and the back cover 110. For example, when the back cover 110 and the display panel 120 are wound around the roller 161, a length of the back cover 110 required for wound around the roller 161 once may be different from a length of the display panel 120 required for being wound around the roller 161 once. That is, since the display panel 120 is disposed outer than the back cover 110 with respect to the roller 161, a length of the display panel 120 required to be wound around the roller 161 once may be larger than a length of the back cover 110 required to be wound around the roller 161 once. As described above, the winding lengths of the back cover 110 and the display panel 120 are different from each other due to the difference of radii of curvature at the time of winding the display unit DP and the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or failures such as cracks may be caused.

In the display device 100 according to an exemplary embodiment of the present disclosure, even though the display unit DP is wound or unwound and a stress is applied to the display unit DP, the plurality of openings 111 of the back cover 110 is flexibly deformed to relieve the stress applied to the back cover 110 and the display panel 120. For example, when the back cover 110 and the display panel 120 are wound around the roller 161 along the column direction, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, a stress which is applied to the display panel 120 from the back cover 110 during the process of winding the back cover 110 and the display panel 120 may also be alleviated due to the deformation of the plurality of openings 111.

Referring to FIGS. 4 and 6, the display panel 120 is disposed on one surface of the first back cover 110a. The display panel 120 is disposed in the first malleable area MA1, on one surface of the first back cover 110a. The display panel 120 is a panel for displaying images to a user. The display panel 120 may include a display element which displays images, a driving element which drives the display element, and wiring lines which transmit various signals to the display element and the driving element.

The display element may be defined in different manners depending on the type of the display panel 120. For example, when the display panel 120 is an organic light emitting display panel 120, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel. Further, since the display device 100 according to the exemplary embodiment of the present disclosure is a rollable display device 100, the display panel 120 may be implemented as a flexible display panel 120 to be wound around or unwound from the roller 161.

The display panel 120 includes a display area AA and a non-display area NA.

The display area AA is an area where images are displayed in the display panel 120. In the display area AA, a plurality of sub pixels which configures the plurality of pixels and a driving circuit for driving the plurality of sub pixels may be disposed. The plurality of sub pixels is minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a driving circuit for driving the plurality of sub pixels may include a driving element and a wiring line. For example, the driving circuit may be configured by a thin film transistor, a storage capacitor, a gate line, and a data line, but is not limited thereto.

The non-display area NA is an area where no image is displayed. In the non-display area NA, various wiring lines and circuits for driving the organic light emitting diode of the display area AA are disposed. For example, in the non-display area NA, a link line which transmits signals to the plurality of sub pixels and driving circuits of the display area AA or a driving IC such as a gate driver IC or a data driver IC may be disposed, but the non-display area is not limited thereto.

In the meantime, the non-display area NA includes a pad area NA1 and a gate driving area NA2.

The pad area NA1 is an area where a plurality of pads is disposed. The plurality of pads is electrodes which electrically connect the plurality of flexible films 130 and the display panel 120 to each other so that the plurality of flexible films 130 and the display panel 120 are electrically connected by the plurality of pads. The pad area NA1 may be a non-display area NA which overlaps the second support area PA2 of the first back cover 110a. However, the pad area NA1 may be formed in the other part of the non-display area NA depending on the arrangement of the plurality of flexible films 130, but is not limited thereto.

The gate driving area NA2 is an area where a gate driver is disposed. The gate driving area NA2 may be a non-display area NA at a left side and a right side of the display area AA. The gate driver outputs a gate voltage and an emission control voltage under the control of the timing controller to select a sub pixel in which a data voltage is charged through a wiring line such as a gate line or an emission control signal line and adjust an emission timing. Hereinafter, it is assumed that the gate driver is formed directly on the substrate 121 by a gate-driver in panel (GIP), but is not limited thereto. In this case, the gate driving area NA2 where the gate driver is disposed may also be referred to as a GIP area.

Referring to FIG. 6, the display panel 120 includes a substrate 121, a buffer layer 122, a pixel unit 123, an encapsulating layer 124, and an encapsulating substrate 125.

The substrate 121 is a base member which supports various components of the display panel 120 and may be configured by an insulating material. The substrate 121 may be formed of a material having flexibility to which the display panel 120 is wound or unwound. For example, the substrate 121 may be formed of a plastic material such as polyimide PI.

The buffer layer 122 is disposed on a top surface of the substrate 121. The buffer layer 122 suppresses moisture and/or oxygen which penetrates from the outside of the substrate 121 from being spread. The buffer layer 122 may be formed of an inorganic material, for example, may be configured by a single layer or a double layer of silicon oxide SiOx and/or silicon nitride SiNx, but is not limited thereto.

The pixel unit 123 is disposed on the top surface of the substrate 121 and the buffer layer 122. The pixel unit 123 includes a plurality of organic light emitting diodes and a circuit for driving the organic light emitting diodes. The pixel unit 123 may be disposed so as to correspond to the display area AA.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material to allow the light emitted from the organic light emitting diode to travel to the lower portion of the substrate 121 and the cathode may be formed of the metal material having a high reflectance.

Hereinafter, for the convenience of description, the description will be made by assuming that the display device 100 according to an exemplary embodiment of the present disclosure is a bottom emission type display device, but it is not limited thereto.

The encapsulating layer 124 is disposed to cover the pixel unit 123.

The encapsulating layer 124 seals the organic light emitting diode of the pixel unit 123. The encapsulating layer 124 may protect the organic light emitting diode of the pixel unit 123 from moisture, oxygen, and impacts of the outside. The encapsulating layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but they are not limited thereto.

The encapsulating substrate 125 is disposed on the encapsulating layer 124. Specifically, the encapsulating substrate 125 is disposed between the encapsulating layer 124 and the first back cover 110a. The encapsulating substrate 125 protects the organic light emitting diode of the pixel unit 123 together with the encapsulating layer 124. The encapsulating substrate 125 may protect the organic light emitting diode of the pixel unit 123 from moisture, oxygen, and impacts of the outside. The encapsulating substrate 125 may be formed of a material having a high modulus of approximately 200 to 900 MPa. The encapsulating substrate 125 may be formed of a metal material, which has a high corrosion resistance and is easily processed in the form of a foil or a thin film, such as aluminum (Al), nickel (Ni), chromium (Cr), or an alloy material of iron (Fe) and nickel. Therefore, as the encapsulating substrate 125 is formed of a metal material, the encapsulating substrate 125 may be implemented as an ultra-thin film and provide a strong resistance against external impacts and scratches.

A first adhesive layer AD1 is disposed between the encapsulating layer 124 and the encapsulating substrate 125. The first adhesive layer AD1 may bond the encapsulating layer 124 and the encapsulating substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed to enclose the encapsulating layer 124 and the pixel unit 123. That is, the pixel unit 123 may be sealed by the buffer layer 122 and the encapsulating layer 124, and the encapsulating layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulating layer 124 and the encapsulating substrate 125. In this case, the first adhesive layer AD1 may further include an absorbent. The absorbent may be particles having hygroscopicity and absorb moisture and oxygen from the outside to minimize permeation of the moisture and oxygen into the pixel unit 123.

A second adhesive layer AD2 is disposed between the encapsulating substrate 125 and the first back cover 110a. The second adhesive layer AD2 may bond the encapsulating substrate 125 and the first back cover 110a to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA), but is not limited thereto.

Even though in FIG. 6, it is illustrated that the plurality of openings 111 of the first back cover 110a is not filled with the second adhesive layer AD2, the second adhesive layer AD2 may be filled in some or all of the plurality of openings 111 of the first back cover 110a. If the second adhesive layer AD2 is filled inside the plurality of openings 111 of the first back cover 110a, a contact area between the second adhesive layer AD2 and the first back cover 110a is increased so that a separation phenomenon between the second adhesive layer AD2 and the first back cover 110a may be avoided.

Even though not illustrated in the drawing, a polarizing plate is disposed on a rear surface of the display panel 120. The polarizing plate selectively transmits light to reduce the reflection of external light which is incident onto the display panel 120. Specifically, the display panel 120 includes various metal materials applied to the semiconductor element, the wiring line, and the organic light emitting diode. Therefore, the external light incident onto the display panel 120 may be reflected from the metal material so that the visibility of the display device 100 may be reduced due to the reflection of the external light. Therefore, when the polarizing plate is disposed, the polarizing plate suppresses the reflection of the external light to increase the outdoor visibility of the display device 100. However, the polarizing plate may be omitted depending on an implementation embodiment of the display device 100.

Referring to FIG. 4, a plurality of flexible films 130 is disposed in the third support area PA3 of the second back cover 110b. The plurality of flexible films 130 is films in which various components are disposed on a base film 131 (see FIGS. 8A and 8B) having a malleability and supplies a signal to the plurality of sub pixels and the driving circuits which configure the plurality of pixels of the display area AA and is electrically connected to the display panel 120. One ends of the plurality of flexible films 130 are disposed in the non-display area NA of the display panel 120 to supply a power voltage or a data voltage to the plurality of sub pixels and the driving circuits of the display area AA. In the meantime, even though the plurality of flexible films 130 is eight in FIG. 4, the number of flexible films 130 may vary depending on the design, but is not limited thereto.

In the meantime, the plurality of flexible films 130 is components in which a base film, data driving ICs for displaying images on the base film, and various driving ICs which controls the data driving ICs are disposed to display images. The plurality of flexible films 130 is electrically connected to the pad area NA1 at one end of the display panel 120 to be bent toward a rear surface of the first back cover 110a. One ends of the plurality of flexible films 130 are connected to one end of the display panel 120 on one surface of the first back cover 110a and the other ends of the plurality of flexible films 130 may be disposed at an opposite surface of the one surface of the first back cover 110a. This will be described in more detail below with reference to FIGS. 7 to 8B.

Referring to FIG. 4, the printed circuit board 140 is disposed on the rear surface of the first back cover 110a to be connected to the plurality of flexible films 130. That is, the printed circuit board 140 is disposed on the rear surface of the first back cover 110a to be connected to the plurality of flexible films 130. The printed circuit board 140 is a component which supplies signals to the driving IC of the plurality of flexible films 130. Various components may be disposed in the printed circuit board 140 to supply various signals such as a driving signal or a data signal to the driving IC. In the meantime, even though two printed circuit boards 140 are illustrated in FIG. 4, the number of printed circuit boards 140 may vary depending on the design and is not limited thereto.

Even though not illustrated in FIG. 4, an additional printed circuit board which is connected to the printed circuit board 140 may be further disposed. For example, the printed circuit board 140 may be referred to as a source printed circuit board S-PCB (Source PCB) on which the data driver is mounted and the additional printed circuit board connected to the printed circuit board 140 may be referred to as a control printed circuit board C-PCB (Control PCB) on which the timing controller is mounted. The additional printed circuit board may be disposed in the roller 161 or disposed in the housing unit HP at the outside of the roller 161, or disposed to be in direct contact with the printed circuit board 140.

Figure 7:
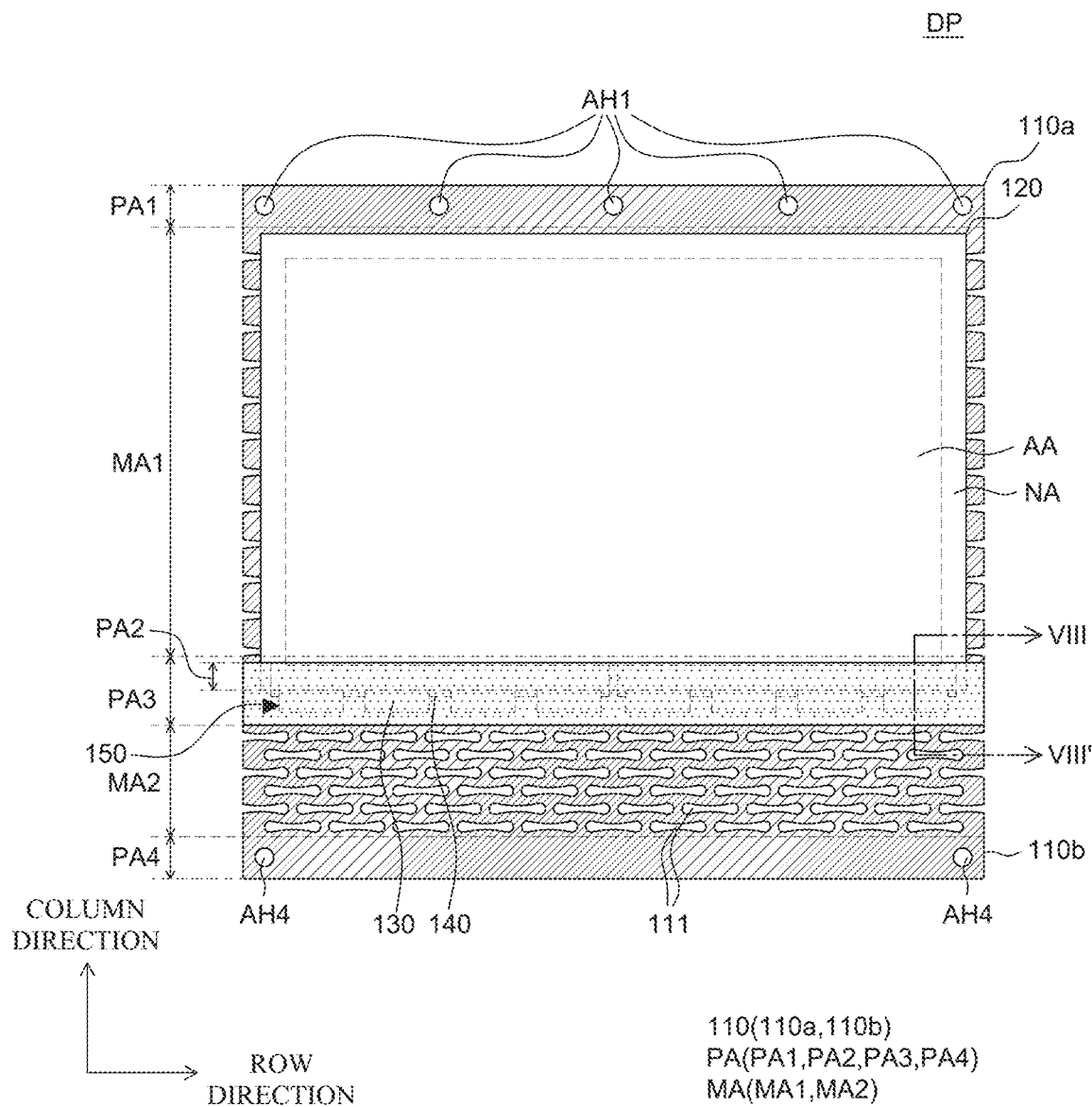
FIG. 7 is a plan view of a display unit of a display device according to an exemplary embodiment of the present disclosure.

FIG. 7 is a plan view of a display unit of a display device according to an exemplary embodiment of the present disclosure.

Figure 8A:
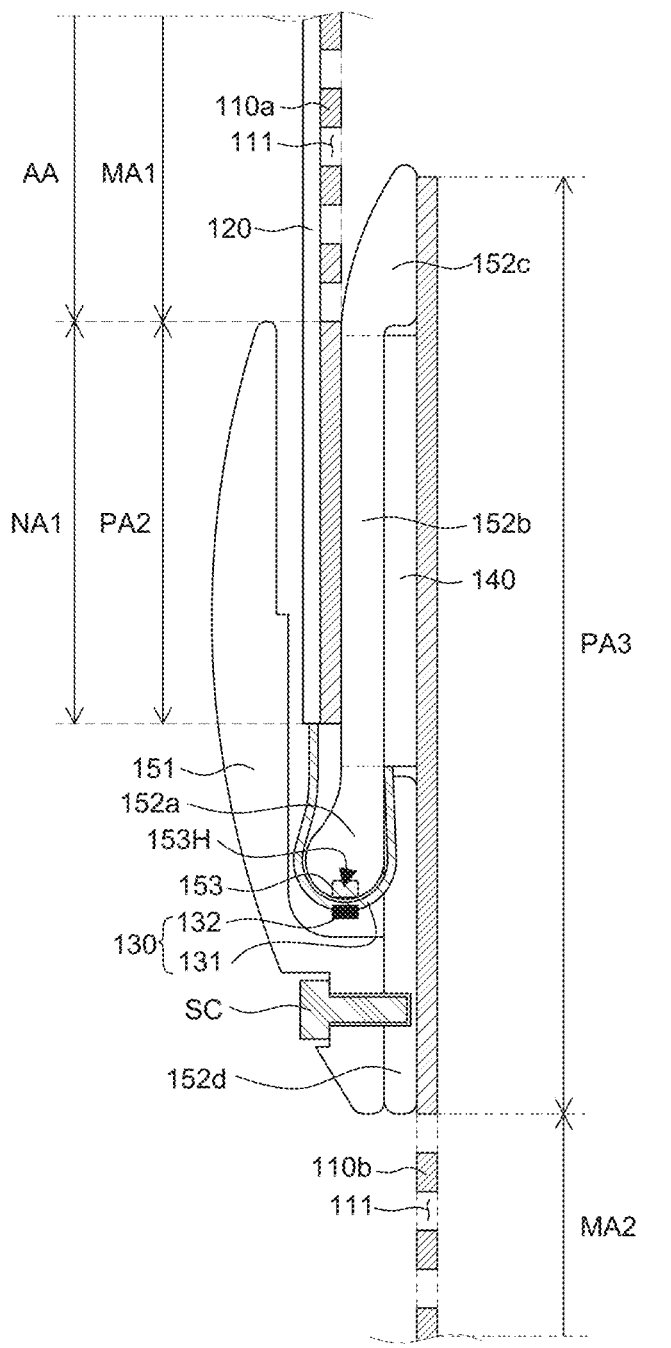
FIGS. 8A and 8B are cross-sectional views taken along the line VIII-VIII' of FIG. 7.
Figure 8B:
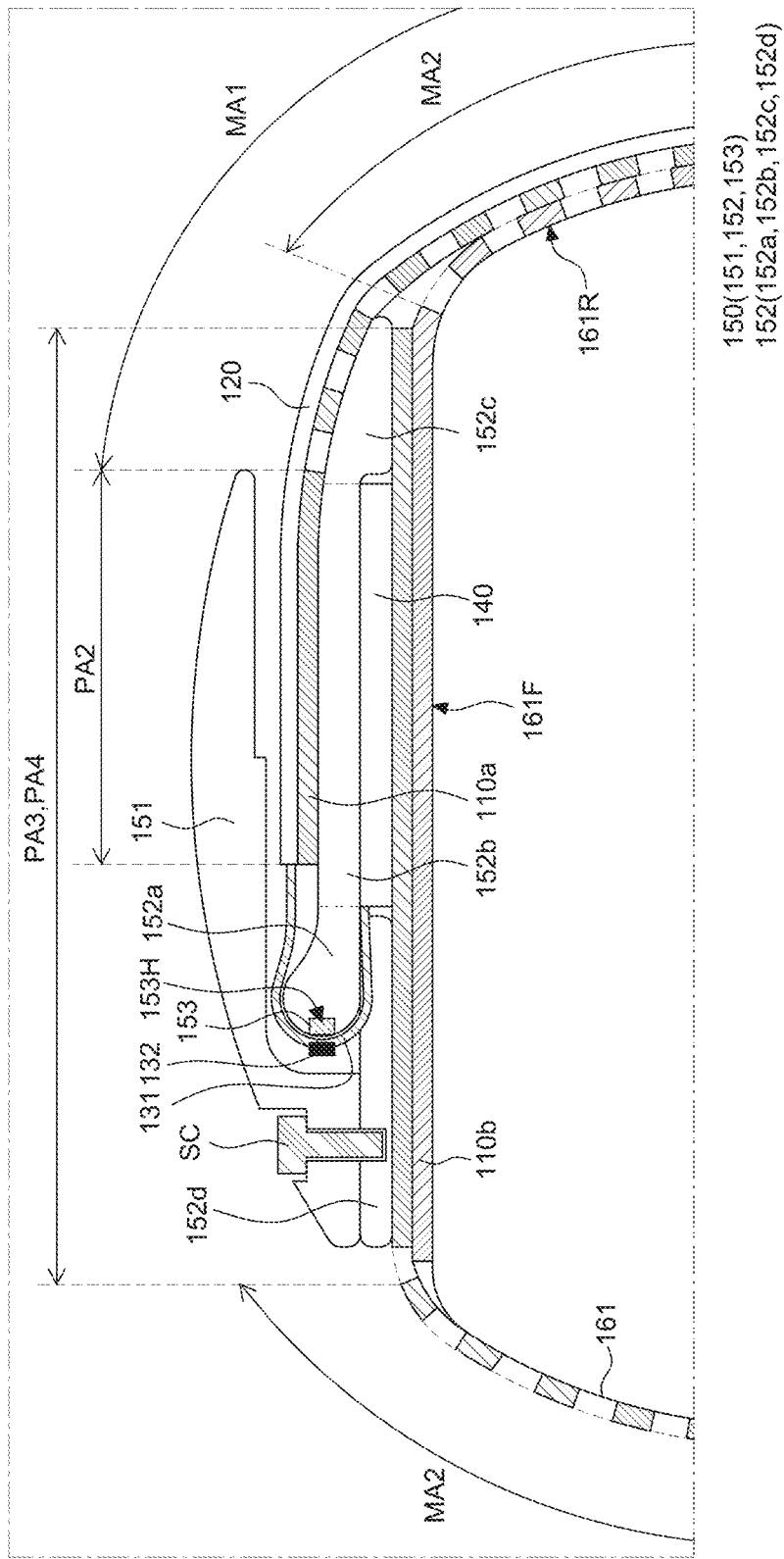

FIGS. 8A and 8B are cross-sectional views taken along the line VIII-VIII' of FIG. 7.

Figure 9:
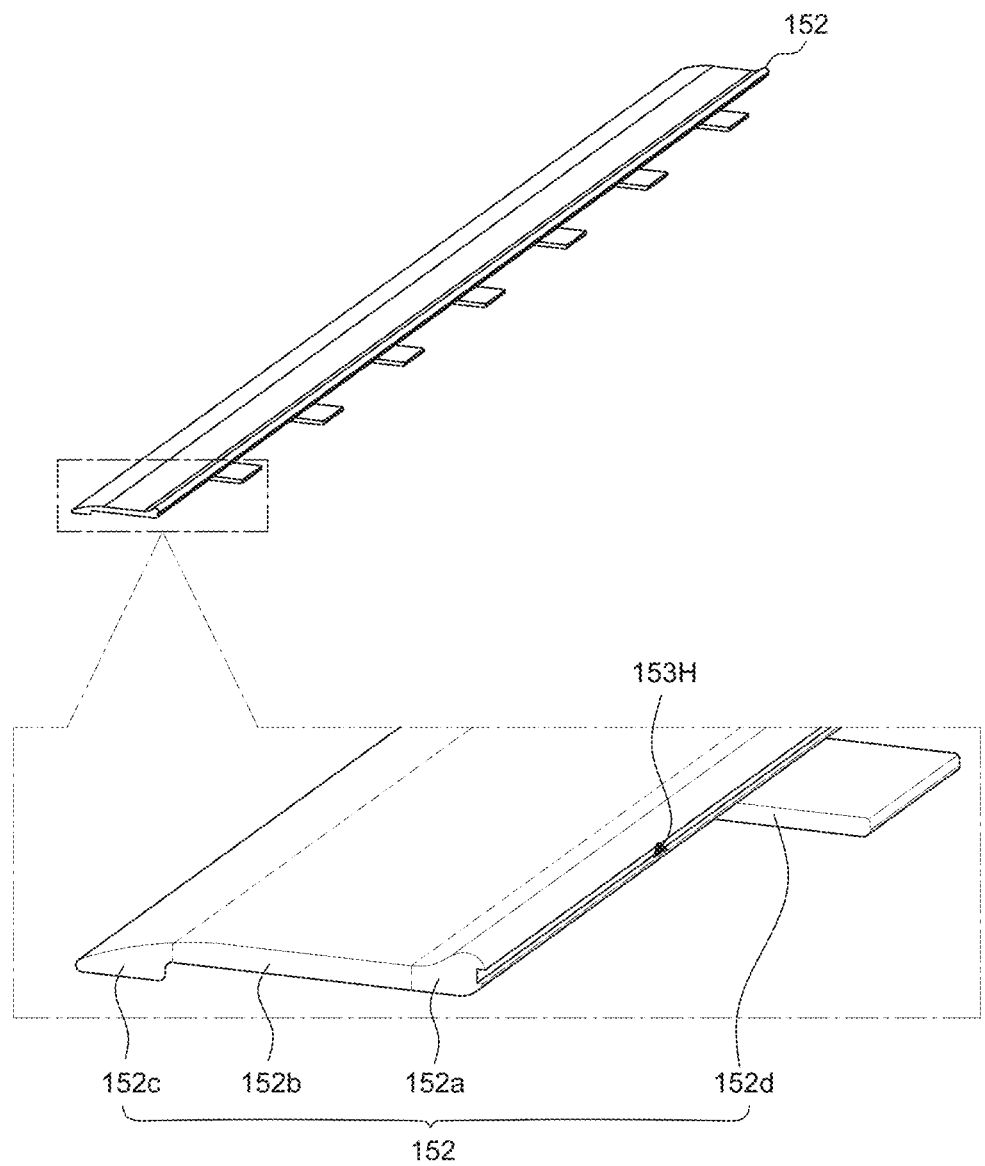
FIG. 9 is a perspective view of a base plate of a cover unit of a display device according to an exemplary embodiment of the present disclosure.

FIG. 9 is a perspective view of a base plate of a cover unit of a display device according to an exemplary embodiment of the present disclosure.

FIG. 7 is a plan view of a display unit DP including a cover unit 150. FIG. 8A is a cross-sectional view illustrating a state in which the cover unit 150 of the display device 100 according to an exemplary embodiment of the present disclosure is unwound from the roller 161. FIG. 8B is a cross-sectional view illustrating a state in which the cover unit 150 of the display device 100 according to an exemplary embodiment of the present disclosure is wound around the roller 161.

Referring to FIGS. 7 and 8A, the cover unit 150 is disposed to protect the pad area NA1 of the display panel 120, the plurality of flexible films 130, and the printed circuit board 140. The cover unit 150 is disposed in the second support area PA2 of the first back cover 110a and the third support area PA3 of the second back cover 110b to maintain the pad area NA1 at one end of the display panel 120 and the printed circuit board 140 to be flat and protect the plurality of flexible films 130.

Referring to FIGS. 8A and 8B, the cover unit 150 includes a cover plate 151 and a base plate 152.

The cover plate 151 is disposed on one surface of the first back cover 110a. The cover plate 151 is disposed so as to cover the pad area NA1 of the display panel 120 and the plurality of flexible films 130. The cover plate 151 may be disposed not to cover the display area AA of the display panel 120, but to cover only the pad area NA1 at one end of the display panel 120. If the cover plate 151 covers also the display area AA, the images displayed in the display area AA may be blocked. Therefore, the cover plate 151 may be disposed so as to overlap only the non-display area NA.

The cover plate 151 is formed of a material having rigidity so that when the display unit DP is wound, the cover plate is not deformed and protects the pad area NA1 at one end of the display panel 120 and the plurality of flexible films 130.

An outer surface of the cover plate 151 is formed to have a convex shape to form a substantially circular shape together with a curved portion 161R of the roller 161. That is, one surface of the cover plate 151 may be formed as a curved surface. When the display unit DP is wound, the cover plate 151 may form a circular shape with the curved portion 161R of the roller 161.

The base plate 152 is disposed on an opposite surface of the one surface of the first back cover 110a, that is, on the rear surface of the first back cover 110a. The base plate 152 is disposed between the first back cover 110a and the printed circuit board 140. The base plate 152 may be fixed to the third support area PA3 of the second back cover 110*b* and may be disposed so as to correspond to the entire second support area PA2 and a part of the first malleable area MA1 of the first back cover 110*a*. The pad area NA1 at one end of the display panel 120, the plurality of flexible films 130, and the printed circuit board 140 may be seated in the base plate 152.

The base plate 152 includes a first part 152*a*, a second part 152*b*, a third part 152*c*, and a fourth part 152*d*.

Referring to FIGS. 8A and 8B, the first part 152*a* protrudes outwardly from the display panel 120. The first part 152*a* is a part which protrudes outwardly from the first back cover 110*a*. An end portion of the first part 152*a* is formed to have a round shape and the plurality of flexible films 130 is disposed so as to enclose the first part 152*a*. The plurality of flexible films 130 which is electrically connected to the pad area NA1 of the display panel 120 through one end may be bent toward the rear surface of the first back cover 110*a* while enclosing the first part 152*a*. In this case, the first part 152*a* in which the plurality of flexible films 130 is seated is formed to have a round shape so that the damage caused when the plurality of flexible films 130 is excessively bent may be minimized. Further, the first part 152*a* may support the plurality of flexible films 130 to be maintained in a bent state regardless of the repeated winding and unwinding of the display unit DP. Therefore, the damage caused when the plurality of flexible films 130 is repeatedly bent and stretched may be minimized.

In the meantime, a driving IC 132 such as a gate driver IC or a data driver IC may be disposed on the base film 131 of the plurality of flexible films 130. The driving IC 132 is a component which processes data for displaying images and a driving signal for processing the data. The driving IC 132 may be disposed by a chip on glass (COG), a chip on film (COF), or a tape carrier package (TCP) depending on a mounting method. However, for the convenience of description, in FIG. 8A, it is illustrated that the driving IC 132 is mounted on the plurality of flexible films 130 by a chip on film technique, but is not limited thereto.

Referring to FIGS. 8A and 9 together, a groove 153H is disposed in the first part 152*a* and a heat dissipating member 153 is disposed in the groove 153H. The heat dissipating member 153 may be disposed so as to correspond to the driving IC 132 of the plurality of flexible films 130. The heat dissipating member 153 effectively dissipates heat generated from the driving IC 132 to improve the reliability of the plurality of flexible films 130. In the meantime, even though it is illustrated that the groove 153H is formed in the first part 152*a* and the heat dissipating member 153 is filled in the groove 153H in the drawings, at least a part of the end portion of the first part 152*a* may be formed of the heat dissipating member 153. However, the arrangement of the heat dissipating member 153 is not limited thereto.

Referring to FIG. 8A, the second part 152*b* is a part extending from the first part 152*a* and the pad area NA1 of the display panel 120, the second support area PA2 of the first back cover 110*a*, and the printed circuit board 140 may be disposed therein. The second support area PA2 of the first back cover 110*a* and the pad area NA1 of the display panel 120 are disposed on one surface of the second part 152*b* and the printed circuit board 140 may be disposed on an opposite surface of the one surface of the second part 152*b*.

The second part 152*b* of the base plate 152 may support the pad area NA1 of one end of the display panel 120 and the printed circuit board 140 to be flat. The base plate 152 is formed of a material having a rigidity to support the pad area NA1 of the display panel 120 and the printed circuit board 140 to be maintained flat. Specifically, the base plate 152 having a rigidity is maintained to be flat without being bent to protect the pad area NA1 of the display panel 120 and the printed circuit board 140. If the pad area NA1 and the printed circuit board 140 are repeatedly bent, the pad area NA1 and the printed circuit board 140 may be easily damaged. Therefore, the pad area NA1 and the printed circuit board 140 are disposed on both surfaces of the second part 152*b* of the base plate 152 having a rigidity so that the pad area NA1 and the printed circuit board 140 may be supported so as not to be bent.

The third part 152*c* is a part which extends from the second part 152*b* to protrude outwardly from the printed circuit board 140. One surface of the third part 152*c* may be formed as a curved surface. Specifically, one surface of the third part 152*c* which faces the first malleable area MA1 of the first back cover 110*a* may be formed as a curved surface. When the display unit DP is wound, the third part 152*c* may form a circular shape with the cover plate 151 and the curved portion 161R of the roller 161.

Referring to FIGS. 8A and 9 together, a plurality of fourth parts 152*d* is parts which extend from the first part 152*a* to the outside of the first part 152*a*. The plurality of fourth parts 152*d* is parts which extend to the outside of the first part 152*a* from the opposite surface of one surface of the first part 152*a*. Some of the plurality of fourth parts 152*d* overlaps the opposite surface of the one surface of the first part 152*a* which faces the second back cover 110*b* and some of the plurality of fourth parts 152*d* is disposed at the outside of the first part 152*a* to overlap the third support area PA3.

Referring to FIG. 9, the plurality of fourth parts 152*d* is disposed to be spaced apart from each other. The plurality of flexible films 130 is disposed between the plurality of fourth parts 152*d* which is spaced apart from each other. The arrangement of the plurality of flexible films 130 which is bent to enclose the first part 152*a* may be guided by the plurality of fourth parts 152*d*.

In the meantime, the fourth part 152*d* may be a part which fixes the cover plate 151 and the base plate 152. The fourth part 152*d* disposed at the outside of the plurality of flexible films 130 may be fixed to the cover plate 151. For example, the base plate 152 and the cover plate 151 may be fixed by the screw SC which passes through the fourth part 152*d* and the cover plate 151. However, the fourth part 152*d* and the cover plate 151 may be fixed by another means such as an adhesive member or a hook, but is not limited thereto.

Referring to FIG. 8B, when the display unit DP is wound, the cover unit 150 may be seated on the flat portion 161F of the roller 161. In this case, the cover plate 151 having the rigidity maintains the convex shape to protect the pad area NA1 of the display panel 120 and the plurality of flexible films 130. The cover plate 151 having a convex shape may form a circular shape with the curved portion 161R of the roller 161. Specifically, the cover plate 151 may form a D shape together with the base plate 152, the second support area PA2 of the first back cover 110*a*, and the third support area PA3 of the second back cover 110*b*. The cover plate 151, the base plate 152, the second support area PA2, and the third support area PA3 having a D shape are seated on the flat portion 161F of the roller 161 to form a circular shape with the curved portion 161R of the roller 161. Accordingly, since the cover plate 151 and the roller 161 form a large circle, the cover unit 150 and the display panel 120 which is wound on the roller 161 may be wound with a larger radius of curvature and a stress applied to the display panel 120 may be reduced.

Further, the third part 152c may not allow a part of the first malleable area MA1 of the first back cover 110a and a part of the display panel 120 to be excessively bent in the vicinity of a boundary of the flat portion 161F and the curved portion 161R of the roller 161. For example, when the third part 152c is not provided, the display panel 120 and the first malleable area MA1 may be bent with a smaller radius of curvature in the vicinity of the boundary of the flat portion 161F and the curved portion 161R of the roller 161, which may result in being damaged. Therefore, the third part 152c and the cover plate 151 having one surface formed as a curved surface are disposed together so that the radius of curvature may be improved in the vicinity of the boundary of the curved portion 161R and the flat portion 161F and a stress which is applied to the display panel 120 may be reduced.

When the display unit DP is wound, the pad area NA1 of the display panel 120 and the printed circuit board 140 which are supported by the base plate 152 to be flat are also wound on the flat portion 161F of the roller 161 so that the pad area NA1 and the printed circuit board 140 may be maintained to be flat. Accordingly, the pad area NA1 of the display panel 120, the printed circuit board 140, and the base plate 152 may be always maintained to be flat regardless of the winding or unwinding of the display unit DP and the damage caused when the pad area NA1 and the printed circuit board 140 are bent may be minimized.

Referring to FIGS. 8A and 8B, the third support area PA3 of the second back cover 110b may support the base plate 152 and the printed circuit board 140 on the rear surface of the first back cover 110a. In this case, the third support area PA3 of the second back cover 110b may be disposed to be spaced apart from the first part 152a and the second part 152b of the base plate 152. If the first part 152a and the second part 152b are in contact with the second back cover 110b to be fixed, it is difficult for the plurality of flexible films 130 to be bent while enclosing the first part 152a. It is further difficult to ensure a space where the printed circuit board 140 is disposed between the second part 152b and the second back cover 110b. Therefore, the first part 152a and the second part 152b of the base plate 152 are spaced apart from the second back cover 110b to ensure a space for disposing the plurality of flexible films 130 and the printed circuit board 140.

The third support area PA3 of the second back cover 110b may be fixed to the third part 152c and the fourth part 152d of the base plate 152. The third part 152c and the fourth part 152d may be in contact with the second back cover 110b to be fixed to each other. For example, a screw which passes through the third fastening holes AH3 of the second back cover 110b is disposed to fix the second back cover 110b and the base plate 152, but the present disclosure is not limited thereto.

Even though not illustrated in the drawings, a separate adhesive member or fastening member is disposed between the second part 152b of the base plate 152 and the second support area PA2 of the first back cover 110a so that the second part 152b and the first back cover 110a are fixed to each other. For example, a screw which passes through the second fastening holes AH2 of the first back cover 110a is disposed to fix the first back cover 110a and the base plate 152, but the present disclosure is not limited thereto.

The first back cover 110a and the second back cover 110b may be connected by the cover unit 150. The first back cover 110a may be fixed to the second part 152b of the base plate 152 and the second back cover 110b may be fixed to the third part 152c and the fourth part 152d of the base plate 152. Therefore, the first back cover 110a and the second back cover 110b may be connected by the base plate 152 of the cover unit 150.

In the display device 100 according to the exemplary embodiment of the present disclosure, the cover unit 150 which supports the pad area NA1 of the display panel 120 and the printed circuit board 140 to be flat is disposed to minimize the damage of the display panel 120 and the printed circuit board 140. Specifically, when the display unit DP is wound around the roller 161, the first back cover 110a and the second back cover 110b are wound while being bent in accordance with the shape of the roller 161. The display panel 120 and the printed circuit board 140 are also wound while being bent in accordance with the shape of the roller 161. In the meantime, when the display unit DP is repeatedly wound and unwound, cracks may be highly likely to be caused in the vicinity of the edge of the display panel 120. For example, when the pad area NA1 of the display panel 120 is repeatedly bent, the cracks may be highly likely to be caused in the vicinity of the pad area NA1. In the pad area NA1, a plurality of pads and various wiring lines which are formed of a metal material having a high hardness and a low malleability may be disposed so that they may be easily cracked due to the stress. The cracks may be spread to the other part of the display panel 120, which may result in the defect of the display device 100. Further, when the printed circuit board 140 which is formed of a rigid material is bent, the printed circuit board 140 may be broken. Therefore, the pad area NA1 of the display panel 120 and the printed circuit board 140 are disposed on the second part 152b of the base plate 152 of the cover unit 150 formed of a material having a rigidity so that the pad area NA1 and the printed circuit board 140 may be maintained to be flat and protected. Here, the second support area PA2 of the first back cover 110a and the third support area PA3 of the second back cover 110b having the rigidity overlap the pad area NA1 and the printed circuit board 140 to support the pad area NA1 and the printed circuit board 140 to be maintained flat. Further, a part of the roller 161 on which the cover unit 150 is wound is formed as a flat portion 161F so that the pad area NA1, the printed circuit board 140, and the base plate 152 may be wound around the roller 161 to be flat. Therefore, even though the pad area NA1 and the printed circuit board 140 are wound around the roller 161, a flat state thereof may be always maintained. For example, when the display unit DP is fully wound, the pad area NA1 and the printed circuit board 140 are seated on the flat portion 161F of the roller 161 to be maintained flat. Further, since the cover plate 151 covers the pad area NA1 and the base plate 152 is disposed to cover the printed circuit board 140, even though the other part of the display unit DP is wound on the pad area NA1 and the printed circuit board 140, the interference with the pad area NA1 and the printed circuit board 140 may be suppressed. Therefore, in the display device 100 according to the exemplary embodiment of the present disclosure, the cover unit 150 which supports the pad area NA1 and the printed circuit board 140 is disposed to maintain the pad area NA1 and the printed circuit board 140 to be flat and protect from the external impact. Further, in the display device 100 according to the exemplary embodiment of the present disclosure, a flat portion 161F is formed on an outer circumferential surface of the roller 161. Therefore, the pad area NA1 and the printed circuit board 140 are not bent and the damage of the display panel 120 and the printed circuit board 140 may be minimized.

In the display device 100 according to the exemplary embodiment of the present disclosure, the printed circuit board 140 is disposed on the rear surface of the display panel 120 to ensure a space in the flat portion 161F of the roller 161 where the pad area NA1 of the display panel 120 is disposed. First, a torsion spring may be further disposed in the roller 161 to rotate the roller 161. However, in order to dispose the torsion spring, a predetermined space is necessary. In this case, in order to avoid the interference between the torsion spring and the flat portion 161F of the roller 161, it may be difficult to form the length of the flat portion 161F to be equal to or larger than a predetermined level. Therefore, the flat portion 161F may have a limited length and a limited area. If the printed circuit board 140, the plurality of flexible films 130, and the pad area NA1 are disposed in one line, it may be difficult for both the printed circuit board 140 and the pad area NA1 to be wound on the flat portion 161F.

Accordingly, in the display device 100 according to the exemplary embodiment of the present disclosure, the plurality of flexible films 130 which is relatively flexible is bent to dispose the printed circuit board 140 on the rear surface of the display panel 120. As the printed circuit board 140 is disposed on the rear surface of the display panel 120, the entire pad area NA1 may be easily wound on the flat portion 161F of the roller 161. Further, the printed circuit board 140 disposed on the rear surface of the pad area NA1 may also be wound on the flat portion 161F of the roller 161. Therefore, in the display device 100 according to the exemplary embodiment of the present disclosure, the printed circuit board 140 and the pad area NA1 overlap to wind the pad area NA1 and the printed circuit board 140 which need to be maintained in a flat state on the flat portion 161F with a limited area. By doing this, the damage of the display panel 120 and the printed circuit board 140 may be minimized. However, the present disclosure is not limited thereto and the printed circuit board 140 may be bent on the front surface of the display panel 120. That is, in the present disclosure, the printed circuit board 140 is bent on the front surface or the rear surface of the display panel 120 so that the display panel 120 is sufficiently seated on the flat portion 161F of the roller 161. Therefore, a bending stress to be applied to the pad area NA1 at one end of the display panel 120 is reduced to suppress the crack.

In the display device 100 according to the exemplary embodiment of the present disclosure, one end of the display panel 120 is disposed at the inside of the cover unit 150 so that the separation of the display panel 120 from the first back cover 110a may be minimized. When the display unit DP is repeatedly wound and unwound, the display panel 120 and the first back cover 110a may be repeatedly bent. When the display panel 120 and the first back cover 110a are repeatedly bent, the adhesiveness of the second adhesive layer AD2 which bonds the display panel 120 with the first back cover 110a may be weakened and the display panel 120 and the first back cover 110a may be separated. Specifically, the separation is generated at the edge of the display panel 120 to be spread to the entire display panel 120. Therefore, one end of the display panel 120 is disposed inside the cover unit 150 to minimize the separation of one end of the display panel 120 from the first back cover 110a. The cover unit 151 is disposed so as to cover one end of the display panel 120 so that the loosening of one end of the display panel 120 from the first back cover 110a may be minimized. Accordingly, in the display device 100 according to the exemplary embodiment of the present disclosure, the cover unit 150 which covers one end of the display panel 120 is disposed to minimize the separation of the display panel 120 from the first back cover 110a.

In the display device 100 according to the exemplary embodiment of the present disclosure, the first part 152a where the plurality of flexible films 130 is disposed is formed to have a round shape and a plurality of fourth parts 152d which guides the location where the plurality of flexible films 130 is bent is disposed. By doing this, the reliability of the plurality of flexible films 130 may be improved. The plurality of flexible films 130 which is electrically connected to the display panel 120 on one surface of the first back cover 110a is bent toward an opposite surface of the one surface of the first back cover 110a to be electrically connected to the printed circuit board 140 on the opposite surface of the one surface of the first back cover 110a. The plurality of flexible films 130 which is bent may be disposed to enclose the first part 152a. In this case, an end portion of the first part 152a which is formed to have a round shape may support the plurality of flexible films 130 so as not to be excessively bent to be damaged. Further, the plurality of fourth parts 152d which protrudes outwardly from the first part 152a and is spaced apart from each other is disposed between the plurality of flexible films 130. Therefore, a position where the plurality of flexible films 130 is seated on the first part 152a may be fixed and guided by the plurality of fourth parts 152d. Accordingly, in the display device 100 according to the exemplary embodiment of the present disclosure, the fourth part 152d is disposed so that when the display unit DP is manufactured, a position where the plurality of flexible films 130 is bent is guided. Further, the first part 152a is disposed so that the damage of the plurality of flexible films 130 due to the excessive bending may be minimized.

The display device 100 according to the exemplary embodiment of the present disclosure may effectively dissipate heat generated from the driving IC 132 of the plurality of flexible films 130. The plurality of flexible films 130 may be disposed to enclose the first part 152a of the base plate 152. In this case, even though heat is generated from the driving IC 132 of the plurality of flexible films 130, the plurality of flexible films 130 is enclosed by the cover unit 150 and the second back cover 110b so that it may be difficult to dissipate heat generated from the driving IC 132 of the plurality of flexible films 130 to the outside. The heat generated from the driving IC 132 may cause the degradation of the performance of the driving IC 132. The heat dissipating member 153 is disposed in the first part 152a corresponding to the driving IC 132 to effectively dissipate heat generated from the driving IC 132. Accordingly, in the display device 100 according to the exemplary embodiment of the present disclosure, the heat dissipating member 153 is disposed in the first part 152a corresponding to the driving IC 132 to improve the reliability of the plurality of flexible films 130.

Figure 10:
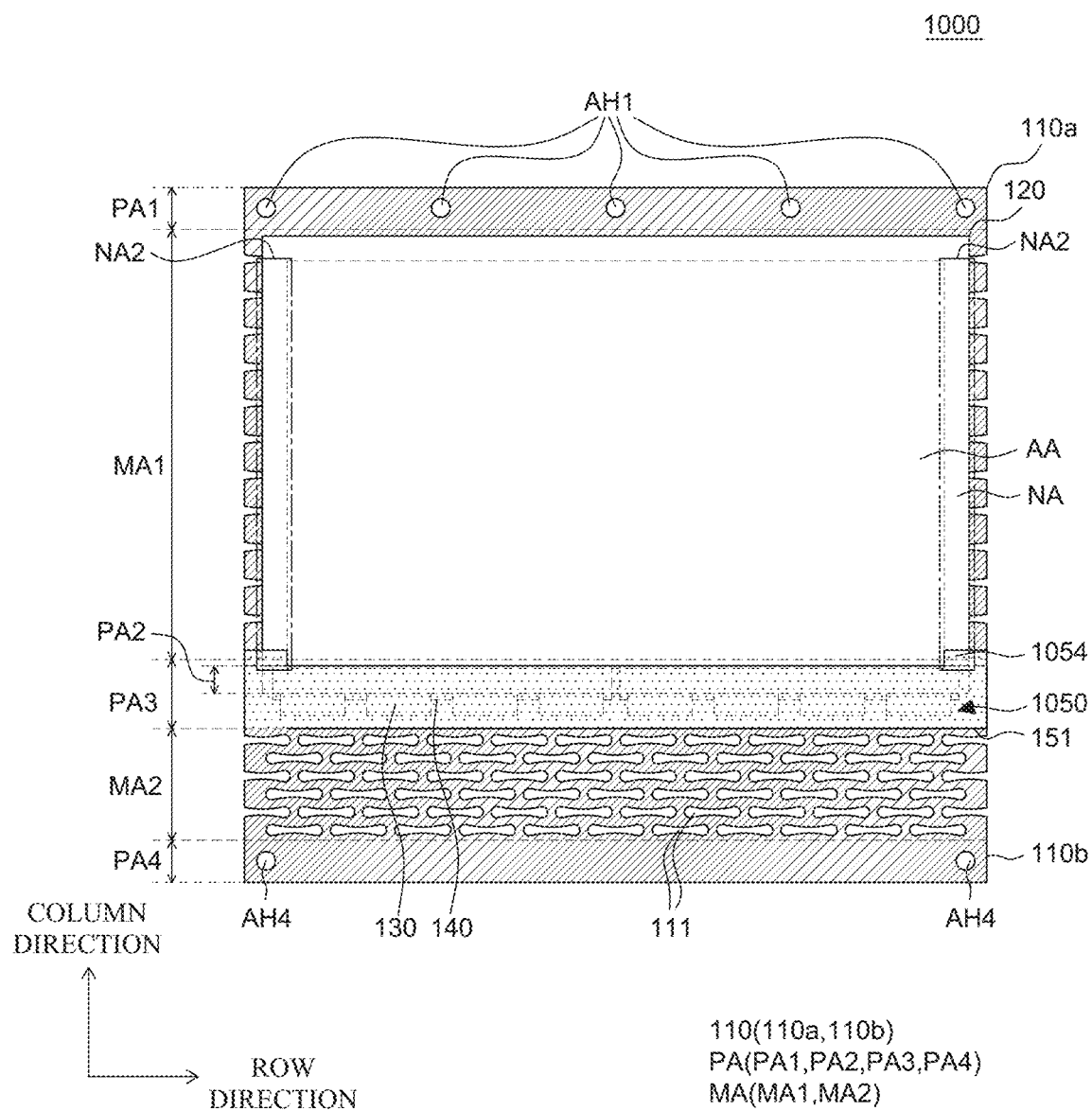
FIG. 10 is a plan view of a display unit of a display device according to another exemplary embodiment of the present disclosure.

FIG. 10 is a plan view of a display unit of a display device according to another exemplary embodiment of the present disclosure.

A display device 1000 of FIG. 10 further includes a protrusion 1054 as compared with the display device 100 of FIGS. 1 to 9, but the other configuration is substantially the same, so that a redundant description will be omitted.

Referring to FIG. 10, the cover unit 1050 according to another exemplary embodiment of the present disclosure further includes a protrusion 1054. The protrusion 1054 is disposed to cover a part of the gate driving area NA2 of the display panel 120. The protrusion 1054 extends so as to cover a part of the gate driving area NA2 at one end of the cover plate 151 which is adjacent to the display area AA. That is, the protrusion 1054 is disposed so as to cover a part of the gate driving area NA2 which extends to an upper side of the pad area NA1 of the display panel 120.

In the display device 1000 according to another exemplary embodiment of the present disclosure, the protrusion 1054 which extends outwardly from the cover plate 151 is further disposed to guide the display unit DP to be wound while forming a gentle curved surface. When the display unit DP is wound, after the cover unit 1050 and the second back cover 110b are wound around the roller 161, the display area AA and the gate driving area NA2 of the display panel 120 may be wound on the cover unit 1050 and the second back cover 110b. In this case, the protrusion 1054 may be disposed so that the display panel 120 and the first pack cover 110a wound on the cover unit 1050 are wound with a gentle curved surface. The protrusion 1054 protrudes outwardly from the cover plate 151 to support the display panel 120 and the first back cover 110a to be wound with a larger radius of curvature. In this case, since the protrusion 1054 is disposed only in the gate driving area NA2, the display panel 120 and the first back cover 110a to be wound on the cover unit 1050 may be supported to be wound with a larger radius of curvature without blocking the display area AA. Accordingly, in the display device 1000 according to another exemplary embodiment of the present disclosure, the protrusion 1054 extending from the cover plate 151 is further disposed to support the display panel 120 and the first back cover 110a wound on the cover unit 1050 to form a gentle curved surface.

In the meantime, the above-described base plate 152 according to the exemplary embodiment of the present disclosure may be disposed between the first back cover 110a and the printed circuit board 140, but is not limited thereto. The base plate may be disposed between the display panel and the printed circuit board, which will be described in more detail by another exemplary embodiment of the present disclosure.

Figure 11:
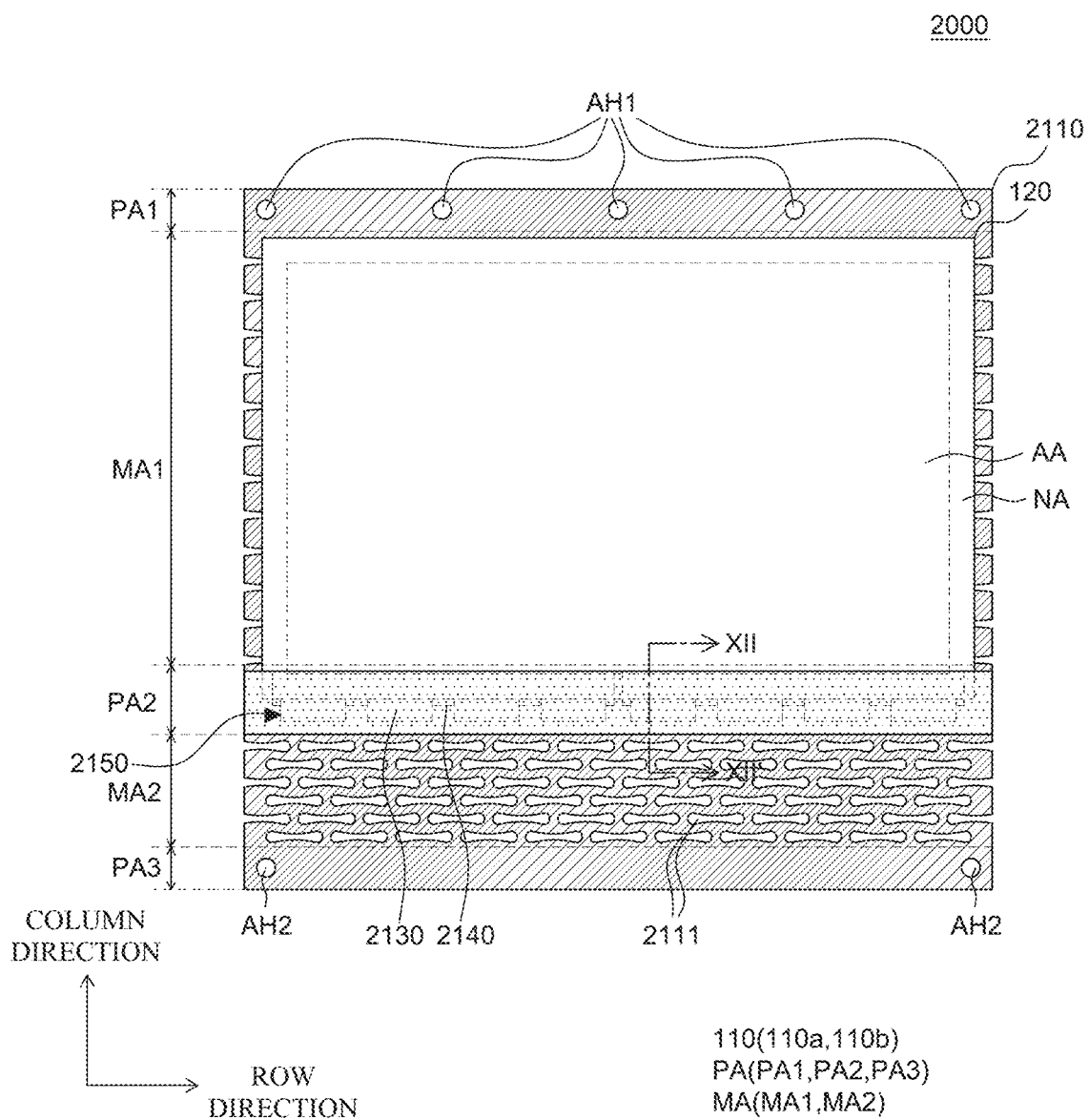
FIG. 11 is a plan view of a display unit of a display device according to still another exemplary embodiment of the present disclosure.

FIG. 11 is a plan view of a display unit of a display device according to still another exemplary embodiment of the present disclosure.

Figure 12:
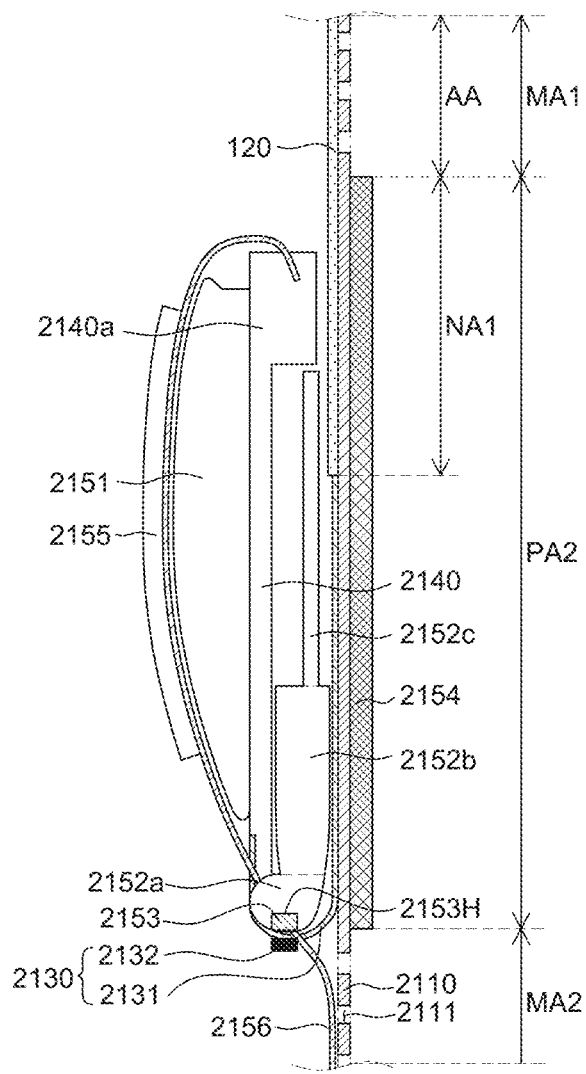
FIG. 12 is a cross-sectional view taken along the line XII-XII' of FIG. 11.

FIG. 12 is a cross-sectional view taken along the line XII-XII' of FIG. 11.

Figure 13:
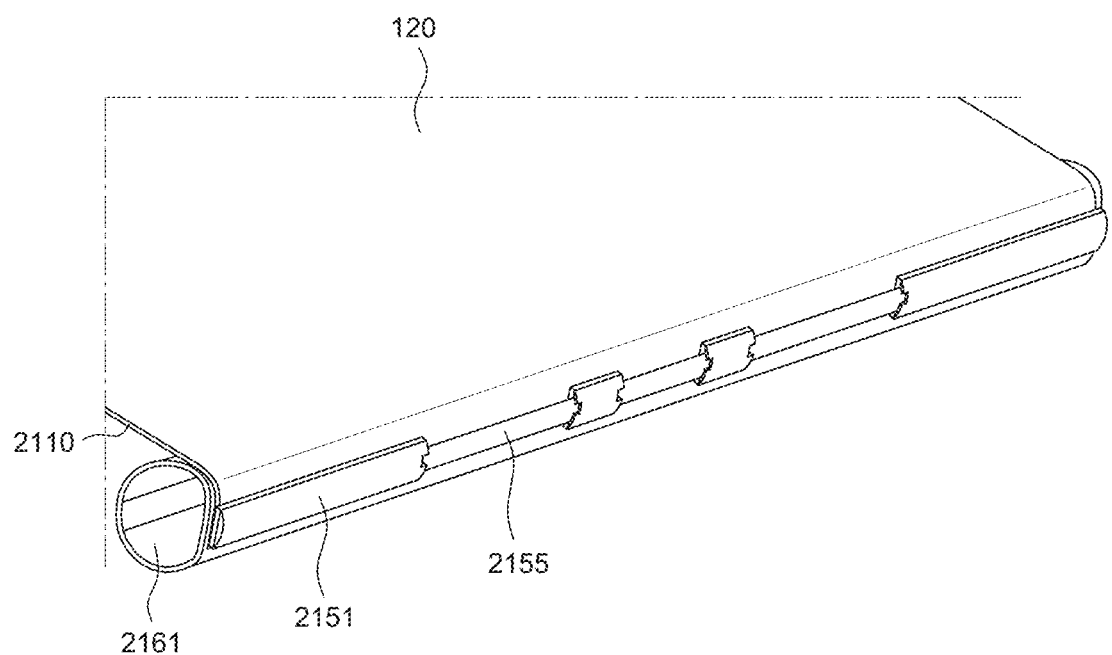
FIG. 13 is a perspective view of a display device according to another exemplary embodiment of the present disclosure.

FIG. 13 is a perspective view of a display device according to another exemplary embodiment of the present disclosure.

Figure 14:
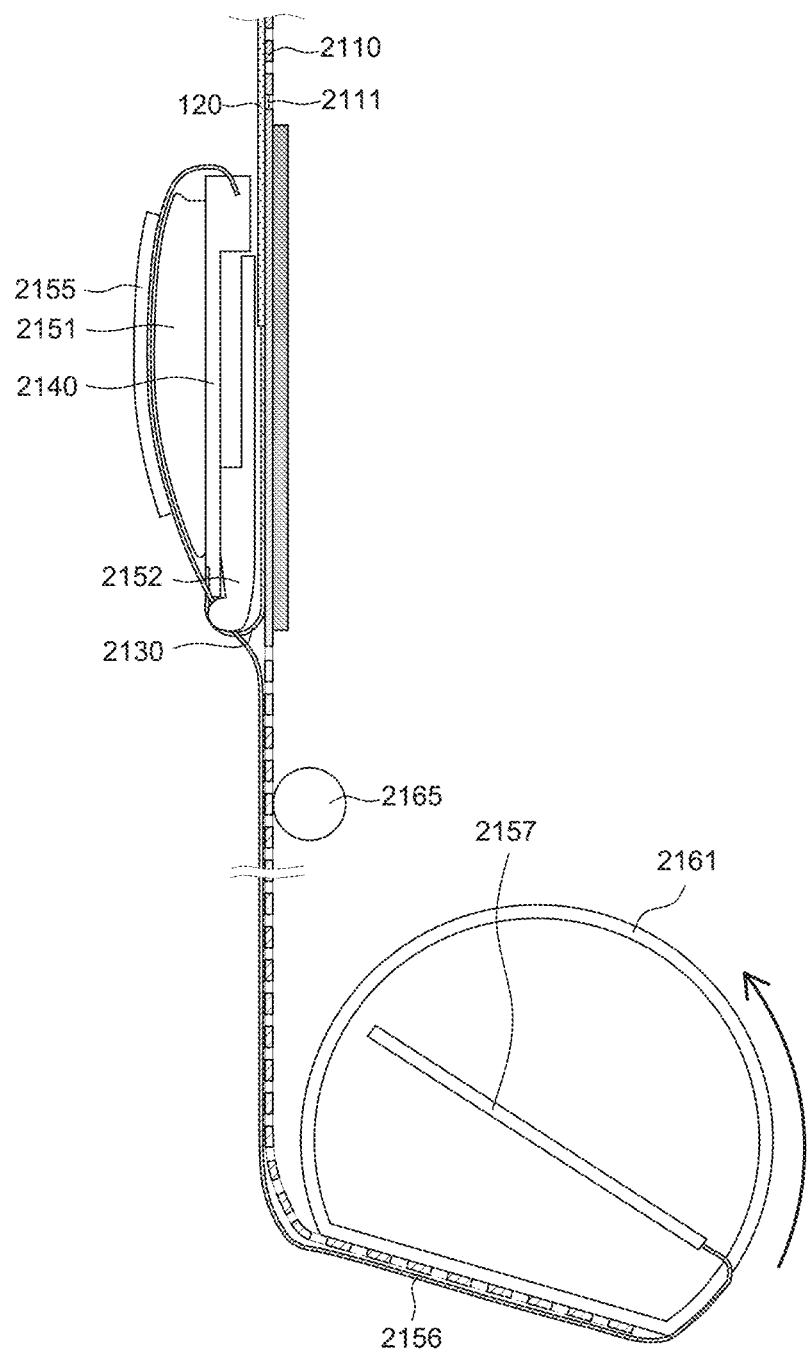
FIG. 14 is a cross-sectional view of a display device according to still another exemplary embodiment of the present disclosure.

FIG. 14 is a cross-sectional view of a display device according to still another exemplary embodiment of the present disclosure.

Figure 15:
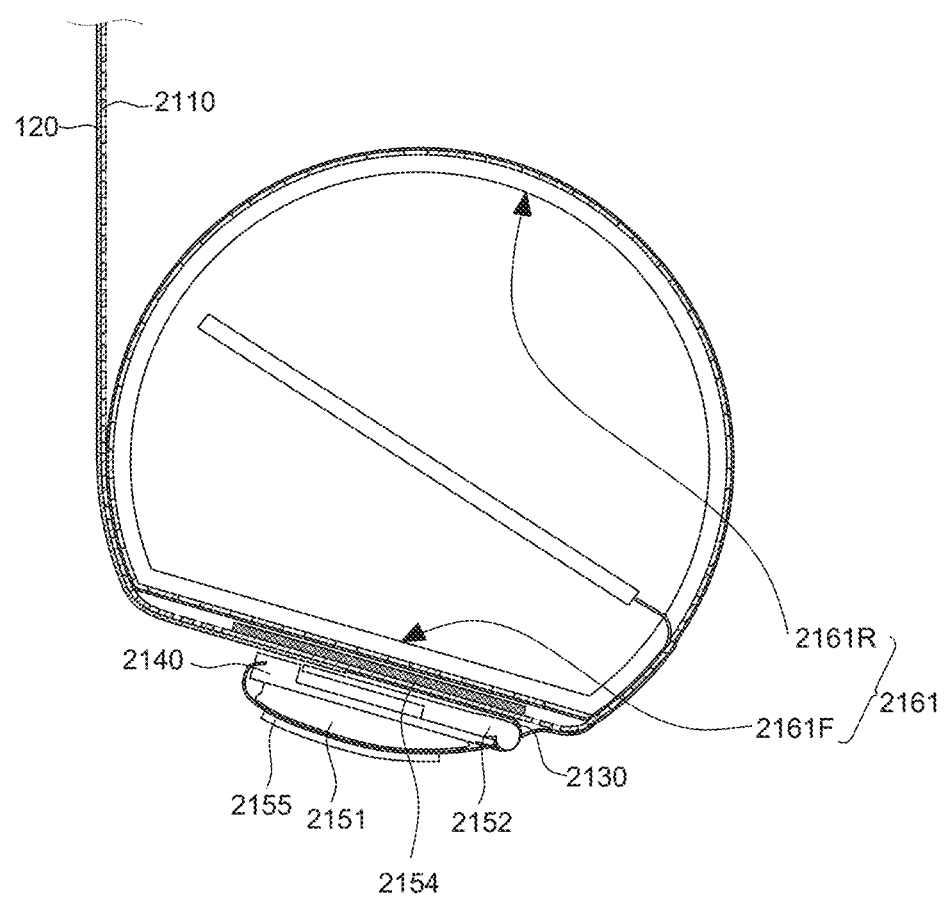
FIG. 15 is a cross-sectional view of a display device according to still another exemplary embodiment of the present disclosure.

FIG. 15 is a cross-sectional view of a display device according to still another exemplary embodiment of the present disclosure.

FIG. 11 is a plan view of a display unit DP including a cover unit 2150.

FIGS. 12 and 14 are cross-sectional views illustrating a state in which a cover unit 2150 of a display device 2000 according to another exemplary embodiment of the present disclosure which is unwound from the roller 2161. FIGS. 13 and 15 are a perspective view and a cross-sectional view illustrating a state in which a cover unit 2150 of a display device 2000 according to another exemplary embodiment of the present disclosure which is wound around the roller 2161.

The display device 2000 according to another exemplary embodiment of the present disclosure illustrated in FIGS. 11 to 15 has the cover unit 2150, the printed circuit board 2140, and the back cover 2110 which have configurations partially different from those of the display device 100 of FIGS. 7 and 9. However, the other part of the configurations and the other configuration are substantially the same.

Referring to FIGS. 11 to 15, the cover unit 2150 is disposed to protect the pad area NA1 of the display panel 120, the plurality of flexible films 2130, and the printed circuit board 2140. The cover unit 2150 is disposed in the second support area PA2 of the back cover 2110 to maintain the pad area NA1 at one end of the display panel 120 and the printed circuit board 2140 to be flat and protect the plurality of flexible films 2130.

In the meantime, another exemplary embodiment of the present disclosure uses a back cover 2110 formed with a single configuration as an example, but is not limited thereto and may be formed by a separated configuration of a first back cover and a second back cover as described in one exemplary embodiment and the other exemplary embodiment of the present disclosure.

The back cover 2110 according to another exemplary embodiment of the present disclosure is disposed on a rear surface of the display panel 120 to support the display panel 120. A size of the back cover 2110 may be larger than a size of the display panel 120. The back cover 2110 may protect other configurations of the display unit DP from the outside.

Even though the back cover 2110 is formed of a material having a rigidity, at least a part of the back cover 2110 may have a flexibility to be wound or unwound together with the display panel 120.

The back cover 2110 includes a plurality of support areas PA and a plurality of malleable areas MA. The plurality of support areas PA is areas where a plurality of openings 2111 is not disposed and the plurality of malleable areas MA is areas where a plurality of openings 2111 is disposed. Specifically, the back cover 2110 includes a first support area PA1, a first malleable area MA1, a second support area PA2, a second malleable area MA2, and a third support area PA3. The first support area PA1, the first malleable area MA1, the second support area PA2, the second malleable area MA2, and the third support area PA3 are sequentially disposed from the uppermost end of the back cover 2110. In this case, since the back cover 2110 is wound or unwound in a column direction, the plurality of support areas PA and the plurality of malleable areas MA may be disposed along the column direction.

The first support area PA1 of the back cover 2110 is an uppermost area of the back cover 2110 and is fastened with the head bar 172. The first support area PA1 includes first fastening holes AH1 to be fastened with the head bar 172. For example, screws which pass through the head bar 172 and the first fastening holes AH1 are disposed so that the head bar 172 is fastened with the first support area PA1. As the first support area PA1 is fastened with the head bar 172, when the link unit 171 which is fastened with the head bar 172 is lifted or lowered, the back cover 2110 is also lifted and lowered together with the display panel 120 which is attached to the back cover 2110. Even though five first fastening holes AH1 are illustrated in FIG. 11, the number of first fastening holes AH1 is not limited thereto. Further, even though it has been described that the back cover 2110 is fastened with the head bar 172 using the first fastening holes AH1, it is not limited thereto and the back cover 2110 and the head bar 172 may be fastened with each other without using a separate fastening hole.

The first malleable area MA1 of the back cover 2110 is an area extending from the first support area PA1 to a lower side of the back cover 2110. The first malleable area MA1 is an area in which a plurality of openings 2111 is disposed and the display panel 120 is attached. Specifically, the first malleable area MA1 is an area which is wound around or unwound from the roller 2161 together with the display panel 120. The first malleable area MA1 may overlap at least the display panel 120 among other configurations of the display unit DP.

The second support area PA2 of the back cover 2110 is an area which extends from the first malleable area MA1. One end of the display panel 120 is disposed in the second support area PA2. For example, a pad area NA1 at one end of the display panel 120 may be disposed in the second support area PA2.

For example, a plurality of flexible films 2130 and a printed circuit board 2140 are disposed in the second support area PA2.

In the meantime, when the second support area PA2 is wound around the roller 2161, a part of the outer circumferential surface of the roller 2161 which is in contact with the second support area PA2 may also be formed to be flat. Therefore, the second support area PA2 may always maintain the flat state regardless of the wound or unwound state to the roller 2161 and the pad area NA1 at one end of the display panel 120 and the printed circuit board 2140 disposed in the second support area PA2 may also maintain the flat state.

The second malleable area MA2 of the back cover 2110 is an area extending from the second support area PA2 to a lower side of the back cover 2110. In the second malleable area MA2, a plurality of openings 2111 is disposed and the second malleable area MA2 extends to dispose the display area AA of the display panel 120 at the outside of the housing unit HP. For example, when the back cover 2110 and the display panel 120 are fully unwound, an area from the third support area PA3 of the back cover 2110 which is fixed to the roller 2161 to the second support area PA2 in which the plurality of flexible films 2130 and the printed circuit board 2140 are disposed may be disposed in the housing unit HP. The first malleable area MA1 and the first support area PA1 in which the display area AA of the display panel 120 is disposed may be disposed at the outside of the housing unit HP. That is, an area from the third support area PA3 fixed to the roller 2161 to the second malleable area MA2 and the second support area PA2 may be disposed in the housing unit HP.

In this case, when a length from the third support area PA3 fixed to the roller 2161 to the second support area PA2 is smaller than a length from the roller 2161 to the opening HPO of the housing unit HP, a part of the display area AA of the display panel 120 may be disposed in the housing unit HP. When a part of the display area AA is disposed in the housing unit HP, it may be difficult to watch the images. Therefore, the length from the third support area PA3 fixed to the roller 2161 to the second support area PA2 may be designed in consideration of a length from the roller 2161 to the opening HPO of the housing unit HP.

The third support area PA3 is an area extending from the second malleable area MA2 to the lower side of the back cover 2110. The third support area PA3 is an uppermost area of the back cover 2110 and is fastened with the roller 2161.

The third support area PA3 may include second fastening holes AH2 to be fastened with the roller 2161. For example, screws which pass through the roller 2161 and the second fastening holes AH2 are disposed to fasten the roller 2161 and the third support area PA3 of the back cover 2110 with each other. As the third support area PA3 is fastened with the roller 2161, the back cover 2110 may be wound around or unwound from the roller 2161. Even though two second fastening holes AH2 are illustrated in FIG. 11, the number of second fastening holes AH2 is not limited thereto.

In the meantime, in the first support area PA1, the second support area PA2, and the third support area PA3, the plurality of openings 2111 as formed in the plurality of malleable areas MA is not formed. Specifically, in the first support area PA1 and the third support area PA3, only the first fastening holes AH1 and the second fastening holes AH2 are formed, but the plurality of openings 2111 as formed in the plurality of malleable areas MA is not formed. Further, the first fastening holes AH1 and the second fastening holes AH2 have different shapes from that of the plurality of openings 2111.

The first support area PA1 is an area fixed to the head bar 172 and the second support area PA2 is an area where one end of the display panel 120, the plurality of flexible films 2130, and the printed circuit board 2140 are supported. The third support area PA3 is an area fixed to the roller 2161 so that it may have a rigidity larger than that of the plurality of malleable areas MA. Specifically, as the first support area PA1, the second support area PA2, and the third support area PA3 have the rigidity, the first support area PA1 and the third support area PA3 may be firmly fixed to the head bar 172 and the roller 2161 respectively. The second support area PA2 maintains the pad area NA1 and the printed circuit board 2140 at one end of the display panel 120 to be flat to protect the pad area NA1 and the printed circuit board 2140 of the display panel 120. Therefore, the display unit DP is fixed to the roller 2161 and the head bar 172 of the driving unit MP to move to the inside or the outside of the housing unit HP in accordance with the operation of the driving unit MP and protect the pad area NA1 and the printed circuit board 2140 at one end of the display panel 120.

In the meantime, in FIG. 11, even though it is illustrated that the plurality of support areas PA and the plurality of malleable areas MA of back cover 2110 are sequentially disposed along the column direction, when the back cover 2110 is wound in the row direction, the plurality of support areas PA and the plurality of malleable areas MA may be sequentially disposed along a row direction.

When the display unit DP is wound or unwound, the plurality of openings 2111 disposed in the plurality of malleable areas MA of the back cover 2110 may be deformed by a stress which is applied to the display unit DP. Specifically, when the display unit DP is wound or unwound, the plurality of malleable areas MA of the back cover 2110 may be deformed as the plurality of openings 2111 contracts or expands. As the plurality of openings 2111 contracts or expands, a slip phenomenon of the display panel 120 disposed on the first malleable area MA1 of the back cover 2110 is minimized so that the stress which is applied to the display panel 120 may be minimized.

When the display panel 120 and the back cover 2110 are wound, a difference between a length of the display panel 120 which is wound around the roller 2161 and a length of the back cover 2110 which is wound around the roller 2161 may be caused due to the difference of radii of curvature of the display panel 120 and the back cover 2110. For example, when the back cover 2110 and the display panel 120 are wound around the roller 2161, a length of the back cover 2110 required for wound around the roller 2161 once may be different from a length of the display panel 120 required for being wound around the roller 2161 once. That is, since the display panel 120 is disposed outer than the back cover 2110 with respect to the roller 2161, a length of the display panel 120 required to be wound around the roller 2161 once may be larger than a length of the back cover 2110 required to be wound around the roller 2161 once. As described above, the winding lengths of the back cover 2110 and the display panel 120 are different from each other due to the difference of radii of curvature at the time of winding the display unit DP and the display panel 120 attached to the back cover 2110 may slide to move from its original position. In this case, a phenomenon that the display panel slides from the back cover 2110 due to the stress and the difference of radii of curvature caused by the winding may be defined as a slip phenomenon. When the slip phenomenon is excessively increased, the display panel 120 may be detached from the back cover 2110 or failures such as cracks may be caused.

In the display device 2000 according to still another exemplary embodiment of the present disclosure, even though the display unit DP is wound or unwound and a stress is applied to the display unit DP, the plurality of openings 2111 of the back cover 2110 is flexibly deformed to relieve the stress applied to the back cover 2110 and the display panel 120. For example, when the back cover 2110 and the display panel 120 are wound around the roller 2161 along the column direction, a stress which deforms the back cover 2110 and the display panel 120 in a vertical direction may be applied. In this case, the plurality of openings 2111 of the back cover 2110 may extend in a vertical direction of the back cover 2110 and the length of the back cover 2110 may be flexibly deformed. Therefore, the difference in lengths of the back cover 2110 and the display panel 120 caused by the difference in radii of curvature during the process of winding the back cover 2110 and the display panel 120 may be compensated by the plurality of openings 2111 of the back cover 2110. Further, a stress which is applied to the display panel 120 from the back cover 2110 during the process of winding the back cover 2110 and the display panel 120 may also be alleviated due to the deformation of the plurality of openings 2111.

Specifically, referring to FIG. 12, the cover unit 2150 includes a cover plate 2151 and a base plate 2152. Further, the cover unit 2150 may further include a heat dissipating member 2153 and a support plate 2154.

The cover plate 2151 may be disposed on one surface of the back cover 2110, that is, on the front surface of the back cover 2110. The cover plate 2151 may be configured to be divided into a plurality of cover plates as illustrated in FIG. 13, but is not limited thereto and may be configured as one bar type. In a case that the cover plate 2151 is configured to be divided into the plurality of cover plates, cable covers 2155 may be disposed between the plurality of cover plates 2151.

The cover plate 2151 is disposed so as to cover the pad area NA1 of the display panel 120 and the plurality of flexible films 2130. The cover plate 2151 may be disposed not to cover the display area AA of the display panel 120, but to cover only the pad area NA1 at one end of the display panel 120. If the cover plate 2151 covers also the display area AA, the images displayed in the display area AA may be blocked. Therefore, the cover plate 2151 may be disposed so as to overlap only the non-display area NA.

The cover plate 2151 is formed of a material having rigidity so that when the display unit DP is wound, the cover plate is not deformed and protects the pad area NA1 at one end of the display panel 120 and the plurality of flexible films 2130.

An outer surface of the cover plate 2151 is formed to have a convex shape to form a substantially circular shape together with a curved portion 2161R of the roller 2161. That is, one surface of the cover plate 2151 is configured as a curved surface and when the display unit DP is wound, the cover plate 2151 may form a substantially circular shape together with the curved portion 2161R of the roller 2161.

The base plate 2152 may be disposed on the front surface of the back cover 2110 together with the cover plate 2151. The base plate 2152 is disposed between the back cover 2110 and the printed circuit board 2140. The base plate 2152 may be fixed to the second support area PA2 of the back cover 2110 and disposed so as to correspond to the second support area PA2 of the back cover 2110. The base plate 2152 is disposed on the pad area NA1 at one end of the display panel 120 and the plurality of flexible films 2130, and the printed circuit board 2140 may be disposed above the base plate 2152.

The base plate 2152 according to still another exemplary embodiment of the present disclosure may include a first part 2152a, a second part 2152b, and a third part 2152c.

The first part 2152a is a part which protrudes outwardly from the display panel 120 and the cover plate 2151. An end portion of the first part 2152a is formed to have a round shape and the plurality of flexible films 2130 is disposed so as to enclose the first part 2152a. The plurality of flexible films 2130 which is electrically connected to the pad area NA1 of the display panel 120 through one end may be bent toward the printed circuit board 2140 while enclosing the first part 2152a. In this case, the first part 2152a in which the plurality of flexible films 2130 is seated is formed to have a round shape so that the damage caused when the plurality of flexible films 2130 is excessively bent may be minimized. Further, the first part 2152a may support the plurality of flexible films 2130 to be maintained in a bent state regardless of the repeated winding and unwinding of the display unit DP. Therefore, the damage caused when the plurality of flexible films 2130 is repeatedly bent and stretched may be minimized.

A driving IC 2132 such as a gate driver IC or a data driver IC may be disposed on the base film 2131 of the plurality of flexible films 2130. The driving IC 2132 is a component which processes data for displaying images and a driving signal for processing the data. The driving IC 2132 may be disposed by a chip on glass (COG), a chip on film (COF), or a tape carrier package (TCP) depending on a mounting method. However, for the convenience of description, in FIG. 12, it is illustrated that the driving IC 2132 is mounted on the plurality of flexible films 2130 by a chip on film technique, but is not limited thereto.

As described in the exemplary embodiment of the present disclosure, a groove 2153H is disposed in the first part 2152a and a heat dissipating member 2153 is disposed in the groove 2153H. The heat dissipating member 2153 may be disposed so as to correspond to the driving IC 2132 of the plurality of flexible films 2130. The heat dissipating member 2153 effectively dissipates heat generated from the driving IC 2132 to improve the reliability of the plurality of flexible films 2130. In the meantime, even though in FIG. 12, it is illustrated that the groove 2153H is formed in the first part 2152a and the heat dissipating member 2153 is filled in the groove 2153H, the present disclosure is not limited thereto. At least a part of the end portion of the first part 2152a may be formed of the heat dissipating member 2153.

Next, the second part 2152b and the third part 2152c are parts extending from the first part 2152a and the pad area NA1 of the display panel 120, a part of the second support area PA2 of the back cover 2110, and the printed circuit board 2140 may be disposed therein. The second part 2152b and the third part 2152c may be configured as one configuration or two divided configurations. Even though in FIG. 12, it is illustrated that the second part 2152b and the third part 2152c have different thicknesses, it is not limited thereto so that the second part 2152b and the third part 2152c may have the same thickness.

The second support area PA2 of the back cover 2110 and a part of the pad area NA1 of the display panel 120 are disposed on one surfaces of the second part 2152b and the third part 2152c and the printed circuit board 2140 may be disposed on an opposite surface of the one surface of the second part 2152b and the third part 2152c.

The second part 2152b mainly serves to support the second support area PA2 of the back cover 2110 and the printed circuit board 2140 therebetween to be maintained in a flat state.

The third part 2152c mainly serves to support the pad area NA1 at one end of the display panel 120 to be maintained in a flat state.

The second part 2152b and the third part 2152c of the base plate 2152 may support the pad area NA1 of one end of the display panel 120 and the printed circuit board 2140 to be flat. The second part 2152b and the third part 2152c are formed of the material having a rigidity to support the pad area NA1 of one end of the display panel 120 and the printed circuit board 2140 to be maintained in a flat state. Specifically, the second part 2152b and the third part 2152c having a rigidity are maintained in a flat state without being bent to protect the pad area NA1 of the display panel 120 and the printed circuit board 2140. If the pad area NA1 and the printed circuit board 2140 are repeatedly bent, the pad area NA1 and the printed circuit board 2140 may be easily damaged. Therefore, the pad area NA1 and the printed circuit board 2140 are disposed on both surfaces of the second part 2152b and the third part 2152c having a rigidity so that the pad area NA1 and the printed circuit board 2140 may be supported so as not to be bent.

In the meantime, a connector 2140a of the printed circuit board 2140 may be located at the outside of the third part 2152c of the base plate 2152. The third part 2152c of the base plate 2152 may support one end of the display panel 120, that is, the pad area NA1 so as not to be bent, together with the connector 2140a of the printed circuit board 2140. One end of the flexible film 2130 which is bent toward the printed circuit board 2140 while enclosing the first part 2152a of the base plate 2152 may be fastened with the connector 2140a of the printed circuit board 2140.

A support plate 2154 may be disposed on the rear surface of the back cover 2110. That is, the support plate 2154 is disposed on the rear surface of the second support area PA2 of the back cover 2110 and overlaps the second support area PA2.

The support plate 2154 may be fastened with the back cover 2110 and/or the display panel 120. For example, the support plate 2154 and the back cover 2110 and/or the display panel 120 are fastened with each other by a screw which passes through the support plate 2154 and the back cover 2110 and/or the display panel 120. However, the support plate 2154 and the back cover 2110 and/or the display panel 120 may be fixed by another means such as an adhesive member or a hook, but are not limited thereto.

The support plate 2154 may be fastened with the base plate 2152 and/or the cover plate 2151. For example, the support plate 2154 and the base plate 2152 and/or the cover plate 2151 are fastened with each other by a screw which passes through the support plate 2154 and the base plate 2152 and/or the cover plate 2151. However, the support plate 2154 and the base plate 2152 and/or the cover plate 2151 may be fixed by another means such as an adhesive member or a hook, but are not limited thereto.

Referring to FIGS. 12 and 15, when the display unit DP is wound, the cover unit 2150 may be seated on the flat portion 2161F of the roller 2161. In this case, the cover plate 2151 having the rigidity maintains the convex shape to protect the pad area NA1 of the display panel 120 and the plurality of flexible films 2130. The cover plate 2151 having a convex shape may form a circular shape with the curved portion 2161R of the roller 2161. Specifically, the cover plate 2151 may form a substantially D shape together with the base plate 2152, the second support area PA2 of the back cover 2110, and the support plate 2154. The cover plate 2151, the base plate 2152, the second support area PA2 of the back cover 2110, and the support plate 2154 having a D shape are seated on the flat portion 2161F of the roller 2161 to form a substantially circular shape with the curved portion 2161R of the roller 2161. Accordingly, since the cover plate 2151 and the roller 2161 substantially form one large circle, the cover unit 2150 and the display panel 120 which is wound on the roller 2161 may be wound with a larger radius of curvature and a stress applied to the display panel 120 may be reduced.

When the display unit DP is wound, the pad area NA1 of the display panel 120 and the printed circuit board 2140 which are supported by the base plate 2152 to be flat are also wound on the flat portion 2161F of the roller 2161 so that the pad area NA1 and the printed circuit board 2140 may be maintained to be flat. Accordingly, the pad area NA1 of the display panel 120, the printed circuit board 2140, and the base plate 2152 may be always maintained to be flat regardless of the winding or unwinding of the display unit DP and the damage caused when the pad area NA1 and the printed circuit board 2140 are bent may be minimized. Further, the support plate 2154 may support the base plate 2152 and the printed circuit board 2140 on the rear surface of the back cover 2110.

Referring to FIGS. 11 to 15, the back cover 2110 may be fastened with the cover unit 2150. The back cover 2110 may be fastened with the second part 2152b of the base plate 2152 and the back cover 2110 may be fastened with the support plate 2154. Therefore, the back cover 2110 may be fastened with the cover unit 2150.

Referring to FIG. 14, an additional printed circuit board 2157 which is coupled to the printed circuit board 2140 may be further disposed. For example, the printed circuit board 2140 may be referred to as a source printed circuit board S-PCB (Source PCB) on which the data driver is mounted and the additional printed circuit board 2157 connected to the printed circuit board 2140 by the cable 2156 may be referred to as a control printed circuit board C-PCB (Control PCB) on which the timing controller is mounted. The additional printed circuit board 2157 may be disposed in the roller 2161, but is not limited thereto, and may be disposed in the housing unit HP at the outside of the roller 2161 or disposed to be in direct contact with the printed circuit board 2140.

One end of the cable 2156 is connected to the connector 2140a of the printed circuit board 2140 and the cable 2156 is bent so as to enclose the cover plate 2151 and then extends along the back cover 2110 to be disposed in the roller 2161. However, it is not limited thereto and the cable 2156 may be disposed in the roller 2161 through an opening equipped in a part of the back cover 2110.

The cable cover 2155 may be disposed on a part of the front surface of the cover unit 2150 so as to cover the cable 2156. The cable cover 2155 may be disposed on the front surface of the cover plate 2151 so as to overlap the cover plate 2151. However, when the cover plate 2151 is configured to be divided into a plurality of cover plates 2151 as illustrated in FIG. 13, the cable cover 2155 may partially overlap the cover plates 2151 and may be located between the plurality of cover plates 2151. However, it is not limited thereto and the cable cover 2155 may be located between the plurality of cover plates 2151 without overlapping the plurality of cover plates 2151.

At least one guide roller 2165 may be further disposed above the roller 2161 for smooth rolling of the display unit DP.

Referring to FIGS. 11 to 15, in the display device 2000 according to still another exemplary embodiment of the present disclosure, the cover unit 2150 which supports the pad area NA1 of the display panel 120 and the printed circuit board 2140 to be flat is disposed to minimize the damage of the display panel 120 and the printed circuit board 2140.

Specifically, when the display unit DP is wound around the roller 2161, the back cover 2110 is wound while being bent in accordance with the shape of the roller 2161. The display panel 120 and the printed circuit board 2140 are also wound while being bent in accordance with the shape of the roller 2161. In the meantime, when the display unit DP is repeatedly wound and unwound, cracks may be highly likely to be caused in the vicinity of the edge of the display panel 120. For example, when the pad area NA1 of the display panel 120 is repeatedly bent, the cracks may be highly likely to be caused in the vicinity of the pad area NA1. In the pad area NA1, a plurality of pads and various wiring lines which are formed of a metal material having a high hardness and a low malleability may be disposed so that they may be easily cracked due to the stress. The cracks may propagate to the other part of the display panel 120, which may result in the defect of the display device 2000. Further, when the printed circuit board 2140 which is formed of a rigid material is bent, the printed circuit board 2140 may be broken. Therefore, the pad area NA1 of the display panel 120 and the printed circuit board 2140 are disposed on the second part 2152b and the third part 2152c of the base plate 2152 of the cover unit 2150 formed of a material having a rigidity so that the pad area NA1 and the printed circuit board 2140 may be maintained to be flat and protected. The second support area PA2 of the back cover 2110 having a rigidity overlaps the pad area NA1 and the printed circuit board 2140 to support the pad area NA1 and the printed circuit board 2140 to be maintained in a flat state. Further, a part of the roller 2161 on which the cover unit 2150 is wound is formed as a flat portion 2161F so that the pad area NA1, the printed circuit board 2140, and the base plate 2152 may be wound around the roller 2161 to be flat. Therefore, even though the pad area NA1 and the printed circuit board 2140 are wound around the roller 2161, a flat state thereof may be always maintained. For example, when the display unit DP is fully wound, the pad area NA1 and the printed circuit board 2140 are seated on the flat portion 2161F of the roller 2161 to be maintained flat. Further, since the cover plate 2151 covers the printed circuit board 2140 and the base plate 2152 is disposed to cover the pad area NA1, even though the other part of the display unit DP is wound on the pad area NA1 and the printed circuit board 2140, the interference with the pad area NA1 and the printed circuit board 2140 may be suppressed. Therefore, in the display device 2000 according to another exemplary embodiment of the present disclosure, the cover unit 2150 which supports the pad area NA1 and the printed circuit board 2140 is disposed to maintain the pad area NA1 and the printed circuit board 2140 to be flat and protect from the external impact. Further, in the display device 2000 according to another exemplary embodiment of the present disclosure, a flat portion 2161F is formed on an outer circumferential surface of the roller 2161. Therefore, the pad area NA1 and the printed circuit board 2140 are not bent and the damage of the display panel 120 and the printed circuit board 2140 may be minimized.

Further, in the display device 2000 according to the exemplary embodiment of the present disclosure, the printed circuit board 2140 is disposed on the front surface of the display panel 120, specifically, on the front surface of the base plate 2152. Therefore, it is possible to ensure a space in the flat portion 2161F of the roller 2161 where the pad area NA1 of the display panel 120 is disposed. First, a torsion spring may be further disposed in the roller 2161 to rotate the roller 2161. However, in order to dispose the torsion spring, a predetermined space is necessary. In this case, in order to avoid the interference between the torsion spring and the flat portion 2161F of the roller 2161, it may be difficult to form the length of the flat portion 2161F to be equal to or larger than a predetermined level. Therefore, the flat portion 2161F may have a limited length and a limited area. If the printed circuit board 2140, the plurality of flexible films 2130, and the pad area NA1 are disposed in one line, it may be difficult for both the printed circuit board 2140 and the pad area NA1 to be wound on the flat portion 2161F. Accordingly, in the display device 2000 according to another exemplary embodiment of the present disclosure, as described in the above-described exemplary embodiment of the present disclosure, the plurality of flexible films 2130 which is relatively flexible is bent to dispose the printed circuit board 2140 on the front surface of the base plate 2152. As the printed circuit board 2140 is disposed on the front surface of the base plate 2152, the entire pad area NA1 may be easily wound on the flat portion 2161F of the roller 2161. Further, the printed circuit board 2140 may also be wound above the pad area NA1 together on the flat portion 2161F of the roller 2161. Therefore, in the display device 2000 according to still another exemplary embodiment of the present disclosure, the printed circuit board 2140 is bent on the front surface of the base plate 2152 to overlap the pad area NA1. Accordingly, the pad area NA1 and the printed circuit board 2140 which need to be maintained to be flat are wound on the flat portion 2161F with a limited area and the damage of the display panel 120 and the printed circuit board 2140 is minimized. Further, a bending stress generated due to the rolling is reduced so that the reliability of the crack of the display panel 120 may be ensured. However, as described above, the present disclosure is not limited thereto and the printed circuit board 2140 may be bent on the rear surface of the display panel 120.

In the display device 2000 according to still another exemplary embodiment of the present disclosure, one end of the display panel 120 is disposed at the inside of the cover unit 2150 so that the separation of the display panel 120 from the back cover 2110 may be minimized. When the display unit DP is repeatedly wound and unwound, the display panel 120 and the back cover 2110 may be repeatedly bent. When the display panel 120 and the back cover 2110 are repeatedly bent, the adhesiveness of the second adhesive layer AD2 which bonds the display panel 120 with the back cover 2110 may be weakened and the display panel 120 and the back cover 2110 may be separated. Specifically, the separation is generated at the edge of the display panel 120 to be spread to the entire display panel 120. Therefore, one end of the display panel 120 is disposed inside the cover unit 2150 to minimize the separation of one end of the display panel 120 from the back cover 2110. Specifically, the cover plate 2151 and the connector 2140*a* of the printed circuit board 2140 are disposed so as to cover one end of the pad area NA1 of the display panel 120 to minimize the loosening of one end of the display panel 120 from the back cover 2110. Accordingly, the display device 2000 according to still another exemplary embodiment of the present disclosure may minimize the separation between the display panel 120 and the back cover 2110.

In the display device 2000 according to still another exemplary embodiment of the present disclosure, the first part 2152*a* where the plurality of flexible films 2130 is disposed is formed to have a round shape to improve the reliability of the plurality of flexible films 2130. The plurality of flexible films 2130 which is electrically connected to the display panel 120 on one surface of the back cover 2110 is bent toward the front surface of the printed circuit board 2140 to enclose the cover plate 2151 and then be bent again to be electrically connected to the connector 2140*a* of one end of the printed circuit board 2140. The plurality of flexible films 2130 which is bent may be disposed to enclose the first part 2152*a*. In this case, an end portion of the first part 2152*a* which is formed to have a round shape may support the plurality of flexible films 2130 so as not to be excessively bent to be damaged. Further, the connector 2140*a* protrudes outwardly from the cover plate 2151 and is fastened with the plurality of flexible films 2130 which is bent again at one end of the cover plate 2151 having a round shape. As described above, the plurality of flexible films 2130 is fixed to the first part 2152*a* of the base plate 2152 to remove repeated bending of the flexible film 2130 generated due to the rolling. Therefore, the defects of the flexible films 2130 such as the disconnection or cracks caused by the rolling are suppressed to improve the durability of the flexible film 2130.

The display device 2000 according to another exemplary embodiment of the present disclosure may effectively dissipate heat generated from the driving IC 2132 of the plurality of flexible films 2130. The plurality of flexible films 2130 may be disposed to enclose the first part 2152*a* of the base plate 2152. Even though heat is generated from the driving IC 2132 of the plurality of flexible films 2130, the plurality of flexible films 2130 is enclosed by the cover unit 2150 and the back cover 2110 so that it may be difficult to dissipate heat generated from the driving IC 2132 of the plurality of flexible films 2130 to the outside. The heat generated from the driving IC 2132 may cause the degradation of the performance of the driving IC 2132. The heat dissipating member 2153 is disposed in the first part 2152*a* corresponding to the driving IC 2132 to effectively dissipate heat generated from the driving IC 2132. Accordingly, in the display device 2000 according to another exemplary embodiment of the present disclosure, the heat dissipating member 2153 is disposed in the first part 2152*a* corresponding to the driving IC 2132 to improve the reliability of the plurality of flexible films 2130.

In the meantime, in the display device 2000 according to still another exemplary embodiment of the present disclosure, as compared with the above-described exemplary embodiment of the present disclosure, there is no mechanical object protruding to the rear surface of the back cover 2110. Therefore, the interference with the roller 2161 during the rolling may be fundamentally removed.

FIGS. 16A to 16E are plan views of sequentially illustrating a manufacturing method of a display device according to still another exemplary embodiment of the present disclosure.

FIGS. 17A to 17E are cross-sectional views of sequentially illustrating a manufacturing method of a display device according to still another exemplary embodiment of the present disclosure.

Figure 16A:
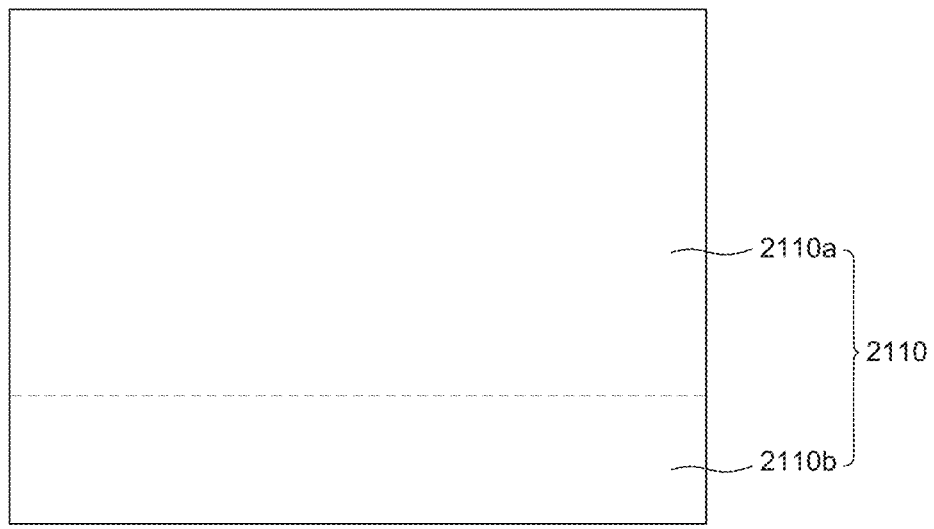
FIGS. 16A to 16E are plan views of sequentially illustrating a manufacturing method of a display device according to still another exemplary embodiment of the present disclosure.
Figure 17A:
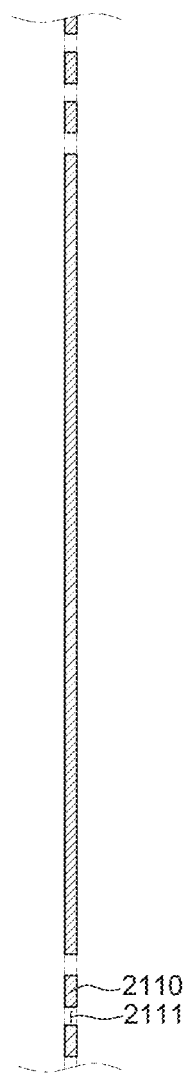
FIGS. 17A to 17E are cross-sectional views of sequentially illustrating a manufacturing method of a display device according to still another exemplary embodiment of the present disclosure.

FIGS. 16A and 17A are a plan view and a cross-sectional view illustrating a back cover 2110 in a display device according to still another exemplary embodiment of the present disclosure.

FIGS. 16A and 17A illustrate a back cover 2110 formed with a single configuration as an example, but the present disclosure is not limited thereto and may be formed by a separated configuration of a first back cover and a second back cover as described in one exemplary embodiment and the other exemplary embodiment of the present disclosure.

Referring to FIGS. 16A and 17A, even though the back cover 2110 is formed of a material having a rigidity, at least a part of the back cover 2110 may have a flexibility to be wound or unwound together with the display panel 120.

The back cover 2110 includes a plurality of support areas PA and a plurality of malleable areas MA. The plurality of support areas PA is areas where a plurality of openings 2111 is not disposed and the plurality of malleable areas MA is areas where a plurality of openings 2111 is disposed.

Since the back cover 2110 is wound or unwound in a column direction, the plurality of support areas PA and the plurality of malleable areas MA may be disposed along the column direction.

For the purpose of convenience, the back cover 2110 may be divided into an upper back cover 2110*a* and a lower back cover 2110*b*. In this case, FIG. 16A illustrates an example that an opening is equipped in a part of the center of the lower back cover 2110*b*, but the present disclosure is not limited thereto.

Figure 16B:
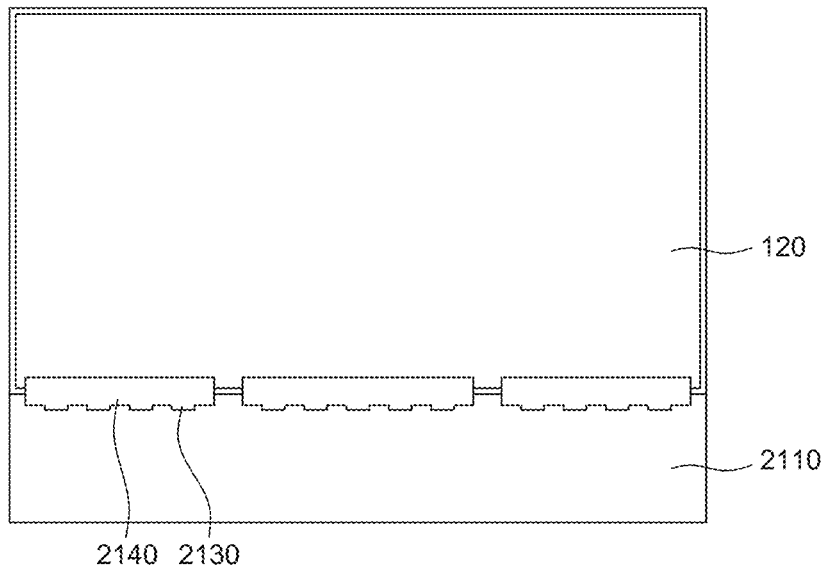
Figure 17B:
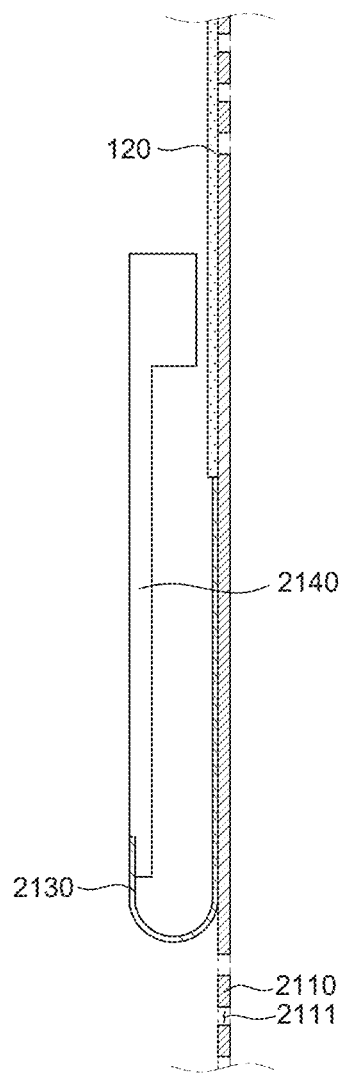

FIGS. 16B and 17B are a plan view and a cross-sectional view illustrating a display device according to still another exemplary embodiment of the present disclosure in which the back cover 2110 and the display panel 120 are fastened with each other.

Referring to FIG. 17B, when a viewing direction is a left side, the back cover 2110 may be fastened from the right side of the display panel 120.

In this case, referring to FIGS. 16B and 17B, the plurality of flexible films 2130 is electrically connected to the rear surface of the display panel 120. The rear surface of the display panel 120 may refer to an opposite surface to the viewing direction. A driving IC such as a gate driver IC or a data driver IC may be disposed on the plurality of flexible films 2130. However, the present disclosure is not limited thereto and the plurality of flexible films 2130 may be electrically connected to the front surface of the display panel 120.

Further, the printed circuit board 2140 may be connected to the plurality of flexible films 2130. The printed circuit board 2140 is a component which supplies signals to the driving IC. Various components may be disposed in the printed circuit board 2140 to supply various signals such as a driving signal or a data signal to the driving IC.

A second adhesive layer AD2 may be interposed between the back cover 2110 and the display panel 120.

The second adhesive layer AD2 may include a double sided adhesive tape.

As described above, in the state in which the plurality of flexible films 2130 and the printed circuit board 2140 are fastened with the display panel 120, the cover unit 2150 may be fastened to fix and support the flexible film 2130 and the printed circuit board 2140.

In this case, for the purpose of convenience, even though FIGS. 16B and 17B illustrate a state in which the plurality of flexible films 2130 is bent, actually the plurality of flexible films 2130 is bent after the plurality of flexible films 2130 and the printed circuit board 2140 are fastened with the base plate 2152.

Figure 16C:
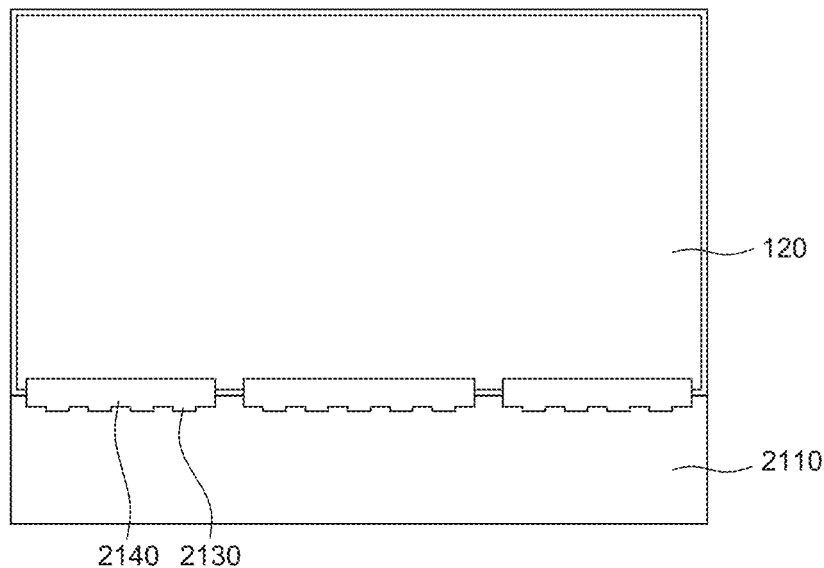
Figure 17C:
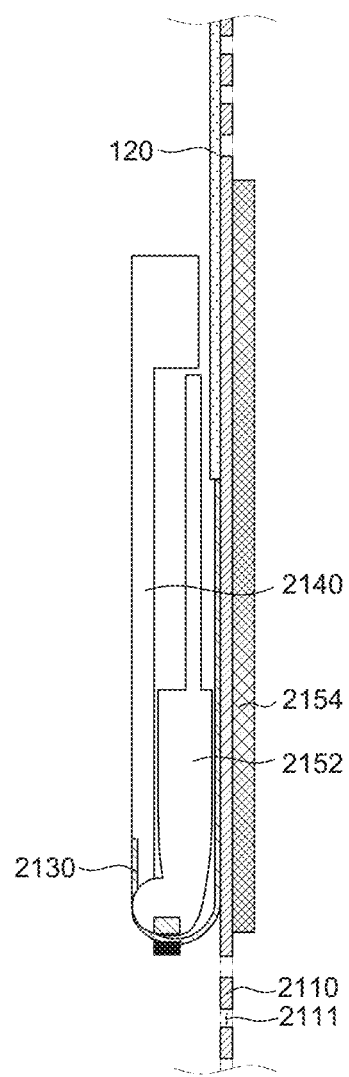

FIGS. 16C and 17C are a plan view and a cross-sectional view illustrating that the plurality of flexible films 2130 and the printed circuit board 2140 are fastened with the base plate 2152 in the display device according to still another exemplary embodiment of the present disclosure.

Referring to FIGS. 16C and 17C, after the plurality of flexible films 2130 and the printed circuit board 2140 are fastened with the display panel 120, the plurality of flexible films 2130 and the printed circuit board 2140 are fastened with the base plate 2152.

The base plate 2152 may be disposed on the front surface of the back cover 2110 together with the cover plate 2151. The base plate 2152 is disposed between the back cover 2110 and the printed circuit board 2140. The base plate 2152 may be fixed to the second support area PA2 of the back cover 2110 and disposed so as to correspond to the second support area PA2 of the back cover 2110. The base plate 2152 is disposed on the pad area NA1 at one end of the display panel 120 and the plurality of flexible films 2130, and the printed circuit board 2140 may be disposed above the base plate 2152.

As described above, the base plate 2152 according to still another exemplary embodiment of the present disclosure may include a first part 2152*a*, a second part 2152*b*, and a third part 2152*c*.

The first part 2152*a* is a part which protrudes outwardly from the display panel 120 and the cover plate 2151. An end portion of the first part 2152*a* is formed to have a round shape and the plurality of flexible films 2130 is disposed so as to enclose the first part 2152*a*. The plurality of flexible films 2130 which is electrically connected to the pad area NA1 of the display panel 120 through one end may be bent toward the printed circuit board 2140 while enclosing the first part 2152*a*. In this case, the first part 2152*a* in which the plurality of flexible films 2130 is seated is formed to have a round shape so that the damage caused when the plurality of flexible films 2130 is excessively bent may be minimized. Further, the first part 2152*a* may support the plurality of flexible films 2130 to be maintained in a bent state regardless of the repeated winding and unwinding of the display unit DP. Therefore, the damage caused when the plurality of flexible films 2130 is repeatedly bent and stretched may be minimized.

Figure 16D:
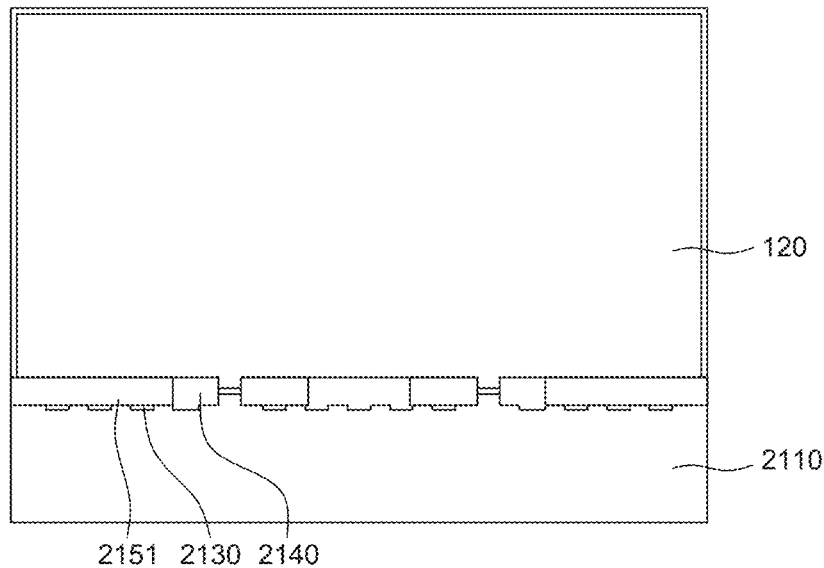
Figure 17D:
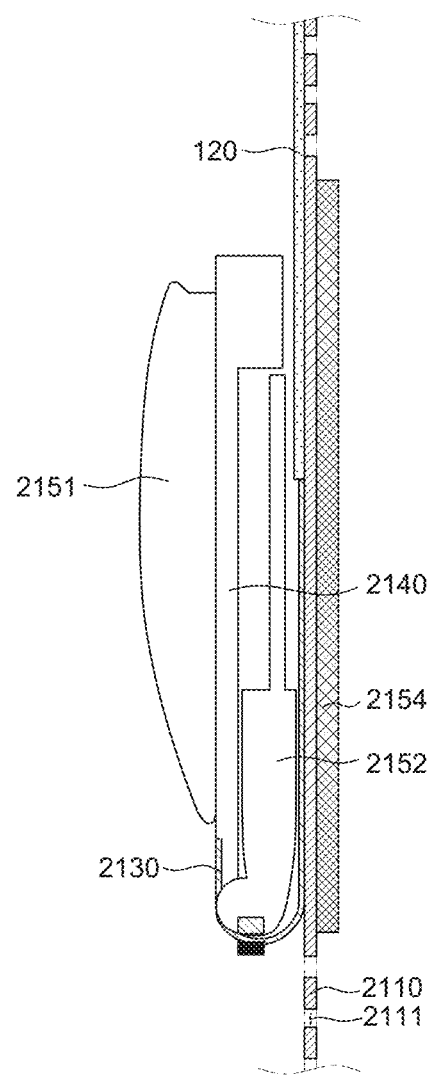

FIGS. 16D and 17D are a plan view and a cross-sectional view illustrating a fastening state of the cover plate 2151 in a display device according to still another exemplary embodiment of the present disclosure.

Referring to FIGS. 16D and 17D, after the plurality of flexible films 2130 and the printed circuit board 2140 and the base plate 2152 are fastened with each other, the cover plate 2151 may be attached on one surface of the back cover 2110, that is, on the front surface of the back cover 2110.

The cover plate 2151 is disposed so as to cover the pad area NA1 of the display panel 120 and the plurality of flexible films 2130. The cover plate 2151 may be disposed not to cover the display area AA of the display panel 120, but to cover only the pad area NA1 at one end of the display panel 120. If the cover plate 2151 covers also the display area AA, the images displayed in the display area AA may be blocked. Therefore, the cover plate 2151 may be disposed so as to overlap only the non-display area NA.

The cover plate 2151 is formed of a material having rigidity so that when the display unit DP is wound, the cover plate is not deformed and protects the pad area NA1 at one end of the display panel 120 and the plurality of flexible films 2130.

An outer surface of the cover plate 2151 is formed to have a convex shape to form a substantially circular shape together with a curved portion 2161R of the roller 2161. That is, one surface of the cover plate 2151 is configured as a curved surface and when the display unit DP is wound, the cover plate 2151 may form a substantially circular shape together with the curved portion 2161R of the roller 2161.

Figure 16E:
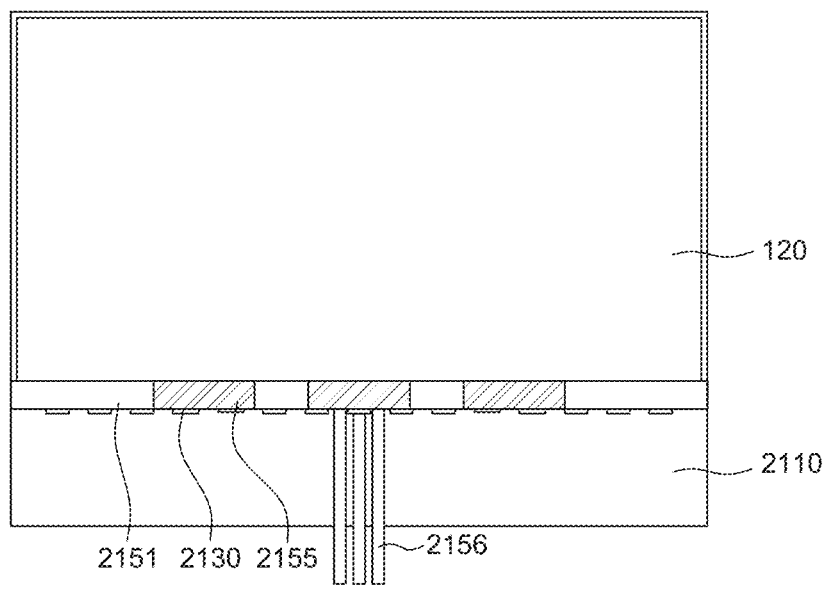
Figure 17E:
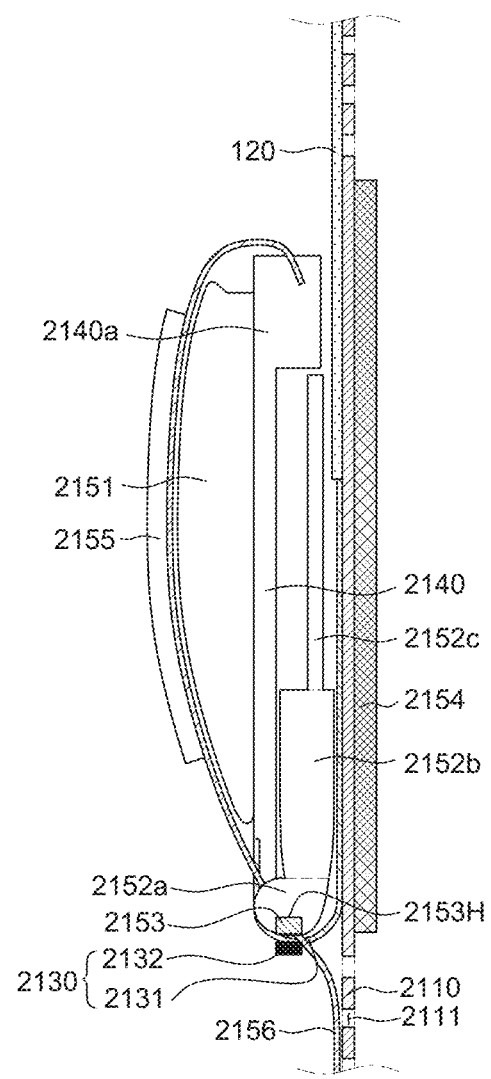

FIGS. 16E and 17E are a plan view and a cross-sectional view illustrating a fastening state of the support plate 2154 and the cable 2156 and the cable cover 2155 in a display device according to still another exemplary embodiment of the present disclosure.

Referring to FIGS. 16E and 17E, the support plate 2154 may be disposed on the rear surface of the back cover 2110. That is, the support plate 2154 is disposed on the rear surface of the second support area PA2 of the back cover 2110 and overlaps the second support area PA2.

In this case, the support plate 2154 may be fastened with the back cover 2110 and/or the display panel 120. For example, the support plate 2154 and the back cover 2110 and/or the display panel 120 are fastened with each other by a screw which passes through the support plate 2154 and the back cover 2110 and/or the display panel 120. However, the support plate 2154 and the back cover 2110 and/or the display panel 120 may be fixed by another means such as an adhesive member or a hook, but are not limited thereto.

The support plate 2154 may be fastened with the base plate 2152 and/or the cover plate 2151. For example, the support plate 2154 and the base plate 2152 and/or the cover plate 2151 are fastened with each other by a screw which passes through the support plate 2154 and the base plate 2152 and/or the cover plate 2151. However, the support plate 2154 and the base plate 2152 and/or the cover plate 2151 may be fixed by another method such as an adhesive member or a hook, but are not limited thereto.

Further, even though not illustrated in the drawings, an additional printed circuit board 2157 which is coupled to the printed circuit board 2140 may be further disposed. The additional printed circuit board 2157 may be disposed in the roller 2161, but is not limited thereto, and may be disposed in the housing unit HP at the outside of the roller 2161 or disposed to be in direct contact with the printed circuit board 2140.

One end of the cable 2156 is connected to the connector 2140*a* of the printed circuit board 2140 and the cable 2156 is bent so as to enclose the cover plate 2151 and then extends along the back cover 2110 to be disposed in the roller 2161.

The cable cover 2155 may be disposed on a part of the front surface of the cover unit 2150 so as to cover the cable 2156.

Figure 18:
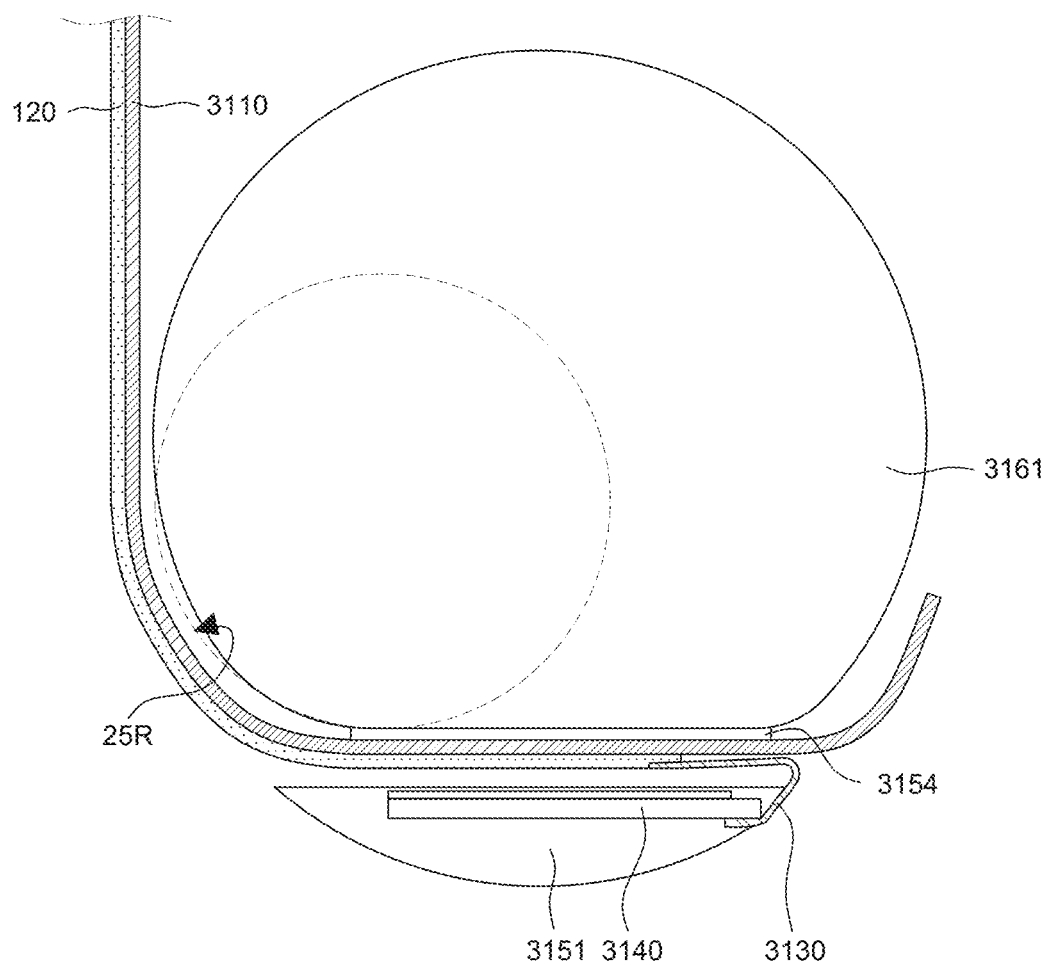
FIG. 18 is a cross-sectional view of a display device according to still another exemplary embodiment of the present disclosure.

FIG. 18 is a cross-sectional view of a display device according to still another exemplary embodiment of the present disclosure.

A display device 3000 according to still another exemplary embodiment of the present disclosure illustrated in FIG. 18 has a roller 3161 and a cover unit 3150 which have configurations partially different from those of the display device 2000 of FIGS. 11 to 15. However, the other configurations are substantially the same.

Referring to FIG. 18, a cover unit 3150 is disposed to protect a pad area NA1 of a display panel 120, a plurality of flexible films 3130, and a printed circuit board 3140.

As described above, the cover unit 3150 is disposed in a second support area of a back cover 3110 to maintain the pad area at one end of the display panel 120 and the printed circuit board 3140 to be flat and protect the plurality of flexible films 3130.

In the meantime, another exemplary embodiment of the present disclosure uses a back cover 3110 formed with a single configuration as an example, but is not limited thereto and may be formed by a separated configuration of a first back cover and a second back cover as described in one exemplary embodiment and the other exemplary embodiment of the present disclosure.

The back cover 3110 according to another exemplary embodiment of the present disclosure is disposed on a rear surface of the display panel 120 to support the display panel 120. A size of the back cover 3110 may be larger than a size of the display panel 120. The back cover 3110 may protect other configurations of the display unit from the outside.

Even though the back cover 3110 is formed of a material having a rigidity, at least a part of the back cover 3110 may have a flexibility to be wound or unwound together with the display panel 120.

The back cover 3110 includes a plurality of support areas PA and a plurality of malleable areas. The plurality of support areas is areas in which the plurality of openings is not disposed and the plurality of malleable areas is areas in which the plurality of openings is disposed. Since the back cover 3110 is wound or unwound in a column direction, the plurality of support areas and the plurality of malleable areas may be disposed along the column direction. However, the present disclosure is not limited thereto and when the back cover 3110 is wound in the row direction, the plurality of support areas and the plurality of malleable areas may be disposed along the row direction.

The cover unit 3150 according to still another exemplary embodiment of the present disclosure is configured to include a cover plate 3151 and a support plate 3154.

The cover plate 3151 may be disposed on one surface of the back cover 3110, that is, on the front surface of the back cover 3110. The cover plate 3151 may be configured to be divided into a plurality of cover plates, but is not limited thereto and may be configured as one bar type.

The cover plate 3151 is disposed to cover the pad area of the display panel 120 and accommodates the printed circuit board 3140 therein. The cover plate 3151 may be disposed not to cover the display area of the display panel 120, but to cover only the pad area at one end of the display panel 120.

The cover plate 3151 is formed of a material having rigidity so that when the display unit is wound, the cover plate is not deformed and protects the pad area at one end of the display panel 120 and the plurality of flexible films 3130.

An outer surface of the cover plate 3151 is formed to have a convex shape to form a substantially circular shape together with a curved portion of the roller 3161.

As described above, the printed circuit board 3140 is inserted into a space in the cover plate 3151 to be fixed. The plurality of flexible films 3130 may be connected to one end of the printed circuit board 3140 inserted into the cover plate 3151 after being bent on the front surface of the display panel 120.

Further, the support plate 3154 may be disposed on the rear surface of the back cover 3110. That is, the support plate 3154 is disposed on the rear surface of the second support area of the back cover 3110 and overlaps the second support area.

The support plate 3154 may be fastened with the back cover 3110 and/or the display panel 120. For example, the support plate 3154 and the back cover 3110 and/or the display panel 120 are fastened with each other by a screw which passes through the support plate 3154 and the back cover 3110 and/or the display panel 120. However, the support plate 3154 and the back cover 3110 and/or the display panel 120 may be fixed by another means such as an adhesive member or a hook, but are not limited thereto.

Further, the support plate 3154 may be fastened with the cover plate 3151. For example, the support plate 3154 and the cover plate 3151 may be fastened with each other by a screw which passes through the support plate 3154 and the cover plate 3151. However, the support plate 3154 and the cover plate 3151 may be fixed by another means such as an adhesive member or a hook, but are not limited thereto.

When the display unit is wound, the cover unit 3150 may be seated on the flat portion of the roller 3161. In this case, the cover plate 3151 having the rigidity maintains the convex shape to protect the pad area of the display panel 120 and the plurality of flexible films 3130. The cover plate 3151 having a convex shape may form a circular shape with the curved portion of the roller 3161. Specifically, the cover plate 3151 may form a substantially D shape together with the second support area of the back cover 3110 and the support plate 3154. The cover plate 3151, the second support area of the back cover 3110, and the support plate 3154 which form a D shape are seated on the flat portion of the roller 3161 to form a substantially circular shape together with the curved portion of the roller 3161. Accordingly, since the cover plate 3151 and the roller 3161 substantially form one large circle, the cover unit 3150 and the display panel 120 which is wound on the roller 3161 may be wound with a larger radius of curvature and a stress applied to the display panel 120 may be reduced.

When the display unit is wound, the pad area of the display panel 120 and the printed circuit board 3140 which are supported by the cover plate 3151 to be flat are also wound on the flat portion of the roller 3161 so that the pad area and the printed circuit board 3140 may be maintained to be flat. Accordingly, the pad area of the display panel 120 and the printed circuit board 3140 may be always maintained to be flat regardless of the winding or unwinding of the display unit and the damage caused when the pad area and the printed circuit board 3140 are bent may be minimized. Further, the support plate 3154 may support the printed circuit board 3140 on the rear surface of the back cover 3110.

Therefore, the back cover 3110 may be fastened with the cover unit 3150. The back cover 3110 may be fastened with the support plate 3154. Therefore, the back cover 3110 may be fastened with the cover unit 3150.

As described above, in the display device 3000 according to the exemplary embodiment of the present disclosure, the cover unit 3150 which supports the pad area of the display panel 120 and the printed circuit board 3140 to be flat is disposed to minimize the damage of the display panel 120 and the printed circuit board 3140. Further, in the display device 3000 according to another exemplary embodiment of the present disclosure, a flat portion is formed on an outer circumferential surface of the roller 3161. Therefore, the pad area and the printed circuit board 3140 are not bent and the damage of the display panel 120 and the printed circuit board 3140 may be minimized.

Further, in the display device 3000 according to the exemplary embodiment of the present disclosure, the printed circuit board 3140 is disposed on the front surface of the display panel 120 to ensure a space in the flat portion of the roller 3161 where the pad area of the display panel 120 is disposed. Therefore, the entire pad area may be easily wound on the flat portion of the roller 3161. Further, the printed circuit board 3140 may also be wound on the flat portion of the roller 3161 above the pad area. However, as described above, the present disclosure is not limited thereto and the printed circuit board 3140 may be bent on the rear surface of the display panel 120.

In the display device 3000 according to still another exemplary embodiment of the present disclosure, one end of the display panel 120 is disposed at the inside of the cover unit 3150 so that the separation of the display panel 120 from the back cover 3110 may be minimized.

In the display device 3000 according to still another exemplary embodiment of the present disclosure, as compared with the above-described exemplary embodiment of the present disclosure, there is no mechanical object protruding to the rear surface of the back cover 3110. Therefore, the interference with the roller 3161 during the rolling may be fundamentally removed.

Further, in the display device 3000 according to still another exemplary embodiment of the present disclosure, a part of the roller 3161 from which the bending of the display unit starts has an increased radius of curvature of 25R from 14R as in the related art so that the crack or rolling failure may be suppressed.

In the existing single-stage D-cut roller having one flat portion, cracking of the display panel may occur at a position of 14R, or rolling failure may occur due to the flow of the flexible film. Further, in the existing double-stage D-cut roller having two flat portions, the display panel may not be cracked at a position of 25R, but a routing unit which is one end of the display panel may be cracked or rolling failure may occur due to the flow of the flexible film.

Therefore, in the display device 3000 according to still another exemplary embodiment of the present disclosure of FIG. 18, the single stage D-cut roller 3161 is modified to ensure a radius of curvature of 25R from 14R as used in the related art.

Further, in the display device 3000 according to the exemplary embodiment of the present disclosure, the printed circuit board 3140 is disposed on the front surface of the display panel 120 to ensure a space in the flat portion of the roller 3161 where the pad area of the display panel 120 is disposed.

Further, in the display device 3000 according to still another exemplary embodiment of the present disclosure, the plurality of flexible films 3130 is bent on the front surface of the display panel 120 to be fixed to the cover unit 3150. Therefore, the repeated bending of the flexible film 3130 caused by the rolling may be removed so that the defects of the flexible films 3130 such as a disconnection or cracks generated by the rolling are suppressed to improve the durability of the flexible film 3130.

The exemplary embodiments of the present disclosure can also be described as follows:

According to an aspect of the present disclosure, there is provided a display device. The display device includes a display panel; a first back cover disposed on a rear surface of the display panel; at least one flexible film which is electrically connected to one end of the display panel and is bent toward a rear surface of the first back cover or a front surface of the display panel; and a printed circuit board which is electrically connected to the at least one flexible film and disposed on the rear surface of the first back cover or the at least one flexible film, wherein the printed circuit board overlaps one end of the display panel.

The display device may further include a cover unit into which one end of the display panel and one end of the first back cover are inserted, wherein the cover unit may include a cover plate which covers one end of the display panel and one end of the first back cover and has one surface formed as a curved surface.

The cover unit may further include a base plate which is disposed between the first back cover and the printed circuit board.

The base plate may include a first part which protrudes outwardly from one end of the display panel; a second part which extends from the first part and allows one end of the display panel, one end of the first back cover, and the printed circuit board to be seated; and a third part which extends from the second part to be disposed at outside of the printed circuit board and has one surface formed as a curved surface.

An end portion of the first part may have a round shape, and the at least one flexible film is disposed so as to enclose the first part.

The at least one flexible film may include a base film having malleability; and a driving IC disposed on the base film, and the cover unit may further include a heat dissipating member which is disposed in the first part so as to correspond to the driving IC.

The base plate may further include a plurality of fourth parts which extends from the first part to outside of the first part, and the at least one flexible film is disposed between the plurality of fourth parts.

The cover plate may be fastened with the plurality of fourth parts.

The display device may further include a second back cover which supports the base plate and the printed circuit board on the rear surface of the first back cover, wherein the second back cover may overlap one end of the display panel, one end of the first back cover, the base plate, the printed circuit board, and the at least one flexible film.

The third part and the plurality of fourth parts may be in contact with the second back cover, and the first part and the second part may be spaced apart from the second back cover.

The display panel may include a display area disposed at outside of the cover unit; and a non-display area which encloses the display area, and the non-display area may include a pad area which is disposed in the cover unit and is electrically connected to the at least one flexible film.

The non-display area may further include gate driving areas at a left side and a right side of the display area and the cover unit may further include a protrusion which extends to cover a part of the gate driving area at one end of the cover plate which is adjacent to the display area.

The cover unit may include a cover plate which is disposed on a front surface of the printed circuit board to cover one end of the display panel and a part of the first back cover and have one surface formed as a curved surface.

The cover unit may further include a base plate disposed between the printed circuit board and the first back cover; and a support plate disposed on the rear surface of the first back cover.

The base plate may include a first part which protrudes outwardly from the display panel and the cover plate; and a second part which extends from the first part and disposes one end of the display panel, a part of the first back cover, and the printed circuit board therein.

The display device may further include a heat dissipating member provided inside the first part.

An end portion of the first part may have a round shape, and the at least one flexible film may be disposed so as to enclose the first part.

The display device may further include a roller to which the display panel and the first back cover are wound or unwound.

The display device may further include an additional printed circuit board which is disposed in the roller and is connected to the printed circuit board through a cable.

One end of the cable may be connected to a connector of the printed circuit board and the cable may be bent to enclose the cover plate and then extends along the first back cover to be disposed in the roller.

The display device may further include a cable cover which is disposed on a part of a front surface of the cover unit to cover the cable.

The cover unit may be disposed so as to cover one end of the display panel on the front surface of the display panel and may include a cover plate which accommodates the printed circuit board.

The cover unit may include a support plate disposed on the rear surface of the first back cover.

The at least one flexible films may be bent on the front surface of the display panel and then connected to one end of the printed circuit board which is inserted into the cover plate.

The display device may further include a roller to which the display panel and the first back cover are wound or unwound, wherein a part of the roller from which the bending of the display panel starts may have a radius of curvature which is different from that of the other part.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A rollable display device, comprising:
   a display panel;
   a first back cover disposed on a rear surface of the display panel;
   a roller around which the display panel and the first back cover are configured to be wound or unwound;
   at least one flexible film which is electrically connected to a bottom end of the display panel in a plan view and is bent toward a rear surface of the first back cover or a front surface of the display panel;
   a printed circuit board which is electrically connected to the at least one flexible film and is disposed outside of the roller on the rear surface of the first back cover or the at least one flexible film;
   an additional printed circuit board which is disposed in the roller and is connected to the printed circuit board through a cable; and
   a cable cover which is disposed on a part of a front surface of a cover unit to cover the cable,
   wherein the printed circuit board overlaps the bottom end of the display panel and the first back cover in the plan view, and
   wherein the printed circuit board is positioned closer to the roller with the display panel in a wound state than in an unwound state.

2. The rollable display device according to claim 1, further comprising:
   the cover unit accommodating the bottom end of the display panel and a bottom end of the first back cover, the bottom end of the first back cover overlapping the bottom end of the display panel in the plan view, wherein the cover unit includes a cover plate which covers the bottom end of the display panel and the bottom end of the first back cover and has a curved front surface.

3. The rollable display device according to claim 2, wherein the cover unit further includes a base plate which is disposed between the first back cover and the printed circuit board.

4. The rollable display device according to claim 3, wherein the base plate includes:
   a first part which protrudes outwardly from the bottom end of the display panel;
   a second part which extends from the first part and allows the bottom end of the display panel, the bottom end of the first back cover, and the printed circuit board to be seated; and
   a third part which extends from the second part to be disposed at outside of the printed circuit board and has a curved surface.

5. The rollable display device according to claim 4, wherein an end portion of the first part of the base plate has a round shape, and the at least one flexible film is disposed so as to wrap around the first part of the base plate.

6. The rollable display device according to claim 4, wherein the at least one flexible film includes:
   a base film having malleability; and
   a driving IC disposed on the base film, and
   wherein the cover unit further includes a heat dissipating member which is disposed in the first part so as to correspond to the driving IC.

7. The rollable display device according to claim 4, wherein the base plate further includes a plurality of fourth parts which extends from the first part to outside of the first part, and the at least one flexible film is disposed between the plurality of fourth parts.

8. The rollable display device according to claim 7, wherein the cover plate is fastened with the plurality of fourth parts.

9. The rollable display device according to claim 7, further comprising:
   a second back cover which supports the base plate and the printed circuit board on the rear surface of the first back cover,
   wherein the second back cover overlaps the bottom end of the display panel, the bottom end of the first back cover, the base plate, the printed circuit board, and the at least one flexible film.

10. The rollable display device according to claim 9, wherein the third part and the plurality of fourth parts of the base plate are in contact with the second back cover, and the first part and the second part of the base plate are spaced apart from the second back cover.

11. The rollable display device according to claim 2, wherein the display panel includes:
    a display area disposed at outside of the cover unit; and
    a non-display area which encloses the display area, and
    wherein the non-display area includes a pad area at the bottom end of the display panel, the pad area being covered by the cover unit and electrically connected to the at least one flexible film.

12. The rollable display device according to claim 11, wherein the non-display area further includes gate driving areas at a left side and a right side of the display area, and
    wherein the cover unit further includes a protrusion which extends to cover a part of the gate driving area at one end of the cover plate which is adjacent to the display area.

13. The rollable display device according to claim 2, wherein the cover plate of the cover unit is disposed on a front surface of the printed circuit board to cover the bottom end of the display panel and the bottom end of the first back cover.

14. The rollable display device according to claim 13, wherein the cover unit further includes:
- a base plate disposed between the printed circuit board and the first back cover; and
- a support plate disposed on the rear surface of the first back cover.

15. The rollable display device according to claim 14, wherein the base plate includes:
- a first part which protrudes outwardly from the display panel and the cover plate; and
- a second part which extends from the first part and is configured hold the bottom end of the display panel, the bottom of the first back cover, and the printed circuit board in place.

16. The rollable display device according to claim 15, further comprising:
- a heat dissipating member provided inside the first part of the base plate.

17. The rollable display device according to claim 15, wherein an end portion of the first part of the base plate has a round shape, and the at least one flexible film is disposed so as to wrap around the first part of the base plate.

18. The rollable display device according to claim 2, wherein the cover unit is disposed so as to cover the bottom end of the display panel on the front surface of the display panel, and wherein the cover plate accommodates the printed circuit board.

19. The rollable display device according to claim 18, wherein the cover unit further includes a support plate disposed on the rear surface of the first back cover.

20. The rollable display device according to claim 19, wherein the at least one flexible film is bent on the front surface of the display panel and then connected to one end of the printed circuit board which is inserted into the cover plate.

21. The rollable display device according to claim 19, wherein a part of the roller from which the winding of the display panel starts has a radius of curvature which is different from a radius of curvature of another part of the roller.

22. The display rollable device according to claim 1, wherein the bottom end of the display panel is closer to the roller than a top end of the display panel in the unwound state, and
wherein the printed circuit board is disposed entirely outside the roller.

23. The rollable display device according to claim 1, wherein one end of the cable is connected to a connector of the printed circuit board, and
wherein the cable is bent to wind around a cover plate and then to extend along the first back cover to be disposed in the roller.

* * * * *